US012812795B2

(12) United States Patent
Chitaka

(10) Patent No.: US 12,812,795 B2
(45) Date of Patent: Nov. 24, 2026

(54) ELECTRONIC DEVICE

(71) Applicant: DENSO CORPORATION, Kariya-city (JP)

(72) Inventor: Hiroki Chitaka, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 92 days.

(21) Appl. No.: 18/786,982

(22) Filed: Jul. 29, 2024

(65) Prior Publication Data

US 2025/0048565 A1 Feb. 6, 2025

(30) Foreign Application Priority Data

Aug. 4, 2023 (JP) ................................ 2023-128128

(51) Int. Cl.
*H05K 5/00* (2025.01)
*H05K 5/06* (2006.01)

(52) U.S. Cl.
CPC ............. *H05K 5/0047* (2013.01); *H05K 5/06* (2013.01)

(58) Field of Classification Search
CPC ...... H05K 5/0026; H05K 5/0047; H05K 5/06; H05K 5/069
See application file for complete search history.

(56) References Cited

U.S. PATENT DOCUMENTS 6,877,995 B1 * 4/2005 Chen .................... H05K 5/0269 361/737
2003/0086246 A1 * 5/2003 Wakabayashi ....... H05K 5/0065 361/728
2009/0322149 A1 * 12/2009 Kishibata ............... H05K 1/148 307/10.1
2012/0113589 A1 5/2012 Sporer
2013/0213708 A1 8/2013 Chitaka et al.
2016/0004241 A1 1/2016 Yoshiike
2019/0098778 A1 * 3/2019 Pandey ................ H05K 5/0065
2019/0300009 A1 10/2019 Sakamoto et al.
(Continued)

FOREIGN PATENT DOCUMENTS

DE 102021208175 A1 2/2023
GB 2541103 A 2/2017
(Continued)

OTHER PUBLICATIONS

U.S. Appl. No. 18/787,199, filed Jul. 29, 2024, Hiroki Chitaka.

*Primary Examiner* — Sagar Shrestha
(74) *Attorney, Agent, or Firm* — Posz Law Group, PLC

(57) ABSTRACT

An electronic device includes a first housing member, a second housing member and a connector. The first housing member houses a first circuit board. The second housing member houses a second circuit board and is assembled to the first housing member. The connector electrically connects the first circuit board and the second circuit board. The second housing member is formed with a second opening in which the connector is disposed, and has a groove part provided at a position facing the first housing member and surrounding a periphery of the second opening. The first housing member is formed with a first opening in which the connector is disposed, and has a protruding part provided at a position facing the second housing member, surrounding a periphery of the first opening, and disposed in the groove part.

19 Claims, 17 Drawing Sheets

(56) References Cited

U.S. PATENT DOCUMENTS

| | | | | |
|---|---|---|---|---|
| 2019/0340116 | A1 | 11/2019 | Miyauchi | |
| 2022/0344243 | A1 * | 10/2022 | Hur | G06F 1/20 |
| 2022/0386492 | A1 * | 12/2022 | Baltrusch | H05K 5/0214 |
| 2024/0224439 | A1 * | 7/2024 | Lee | H05K 5/30 |
| 2025/0168995 | A1 * | 5/2025 | Kim | H05K 5/0217 |

FOREIGN PATENT DOCUMENTS

| | | | |
|---|---|---|---|
| JP | S61-088272 | U | 6/1986 |
| JP | 3020594 | U | 2/1996 |
| JP | H08-125371 | A | 5/1996 |
| JP | H08-204363 | A | 8/1996 |
| JP | 2008-131752 | A | 6/2008 |
| JP | 2009-054041 | A | 3/2009 |
| JP | 6567894 | B2 | 8/2019 |
| WO | 2019/082647 | A1 | 5/2019 |
| WO | 2022/192031 | A1 | 9/2022 |

* cited by examiner

ELECTRONIC DEVICE

CROSS REFERENCE TO RELATED APPLICATION

The present application claims the benefit of priority from Japanese Patent Application No. 2023-128128 filed on Aug. 4, 2023. The entire disclosures of the above application are incorporated herein by reference.

TECHNICAL FIELD

The present disclosure relates to an electronic device.

BACKGROUND

For example, an electronic device includes a circuit board, an electronic component disposed on the circuit board, and a heat conduction member disposed on the electronic component.

SUMMARY

The present disclosure describes an electronic device. According to an aspect of the present disclosure, an electronic device includes a first housing member, a second housing member and a connector. The first housing member houses a first circuit board. The second housing member houses a second circuit board and is assembled to the first housing member. The connector electrically connects the first circuit board and the second circuit board. The second housing member is formed with a second opening in which the connector is disposed, and has a groove part that is located at a position facing the first housing member and surrounds a periphery of the second opening. The first housing member is formed with a first opening in which the connector is disposed, and has a protruding part that is located at a position facing the second housing member, surrounds a periphery of the first opening, and is disposed in the groove part.

DETAILED DESCRIPTION

Figure 1:
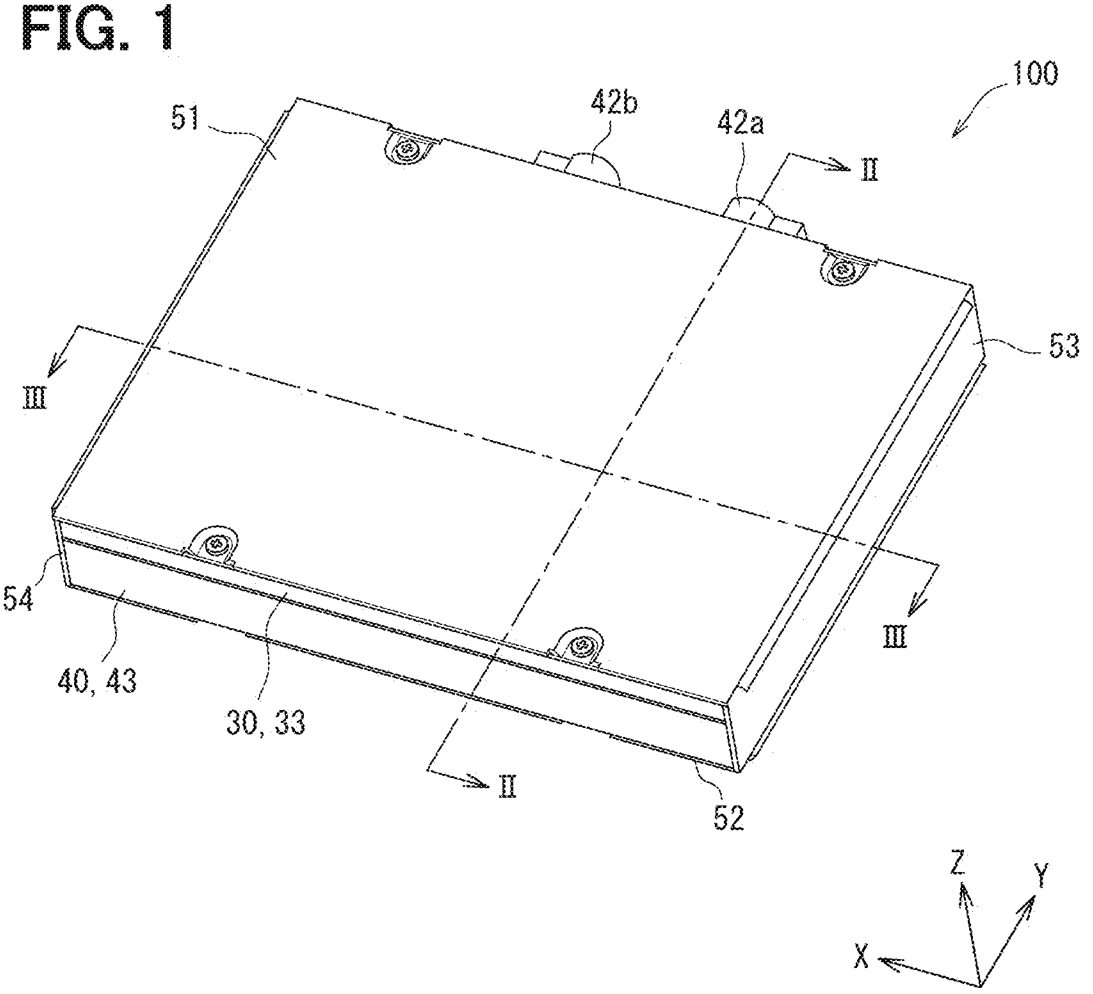
FIG. 1 is a perspective view showing a schematic configuration of an electronic device according to a first embodiment.

For example, an electronic device includes a circuit board, an electronic component disposed on the circuit board, and a heat conduction member disposed on the electronic component. In such an electronic device, it is conceivable to electrically connect two circuit boards to each other by a connector. In such a configuration, there is a fear that the connector of the electronic device may become wet with liquid refrigerant or water droplets due to condensation.

The present disclosure provides an electronic device capable of suppressing a connector from being wet.

According to an aspect of the present disclosure, an electronic device includes a first housing member, a second housing member and a connector. The first housing member houses a first circuit board. The second housing member houses a second circuit board and is assembled to the first housing member. The connector electrically connects the first circuit board and the second circuit board. The second housing member is formed with a second opening in which the connector is disposed, and has a groove part that is located at a position facing the first housing member and surrounds a periphery of the second opening. The first housing member is formed with a first opening in which the connector is disposed, and has a protruding part that is located at a position facing the second housing member, surrounds a periphery of the first opening, and is disposed in the groove part.

In this manner, in the electronic device, the protruding part of the first housing member surrounding the periphery of the first opening is disposed in the groove part of the second housing member surrounding the periphery of the second opening. Therefore, in the electronic device, the groove part and the protruding part can restrict water, which comes from outside the connector, from reaching the connector.

Aspects disclosed in this specification adopt different technical solutions from each other in order to achieve their respective objectives. Objects, features, and advantageous effects disclosed in this specification will be more apparent by referring to the following detailed descriptions and accompanying drawings.

Embodiments of the present disclosure will be described hereinafter with reference to the drawings. Hereinafter, three directions orthogonal to each other are referred to as an X direction, a Y direction, and a Z direction, respectively.

First Embodiment

An electronic device 100 according to an embodiment will be described with reference to FIGS. 1 to 10. The electronic device 100 mainly includes a first circuit board 10, a second circuit board 20, a first housing member 30, and a second housing member 40. In the present embodiment, as an example, the electronic device 100 includes a first cover 51, a second cover 52, a third cover 53, and a fourth cover 54. The electronic device 100 is configured to cool the first circuit board 10 and the second circuit board 20 with cooling water CW1. The cooling water CW1 corresponds to a liquid refrigerant.

The electronic device 100 is configured so as to be mountable on a movable object such as a vehicle. For example, the electronic device 100 can be applied to an electronic control unit. The electronic device 100 can be applied to an integrated control unit in which multiple functions are integrated. The electronic device 100 can be applied to an electronic control unit for automatic driving. The respective components will be described below.

<First Circuit Board>

Figure 2:
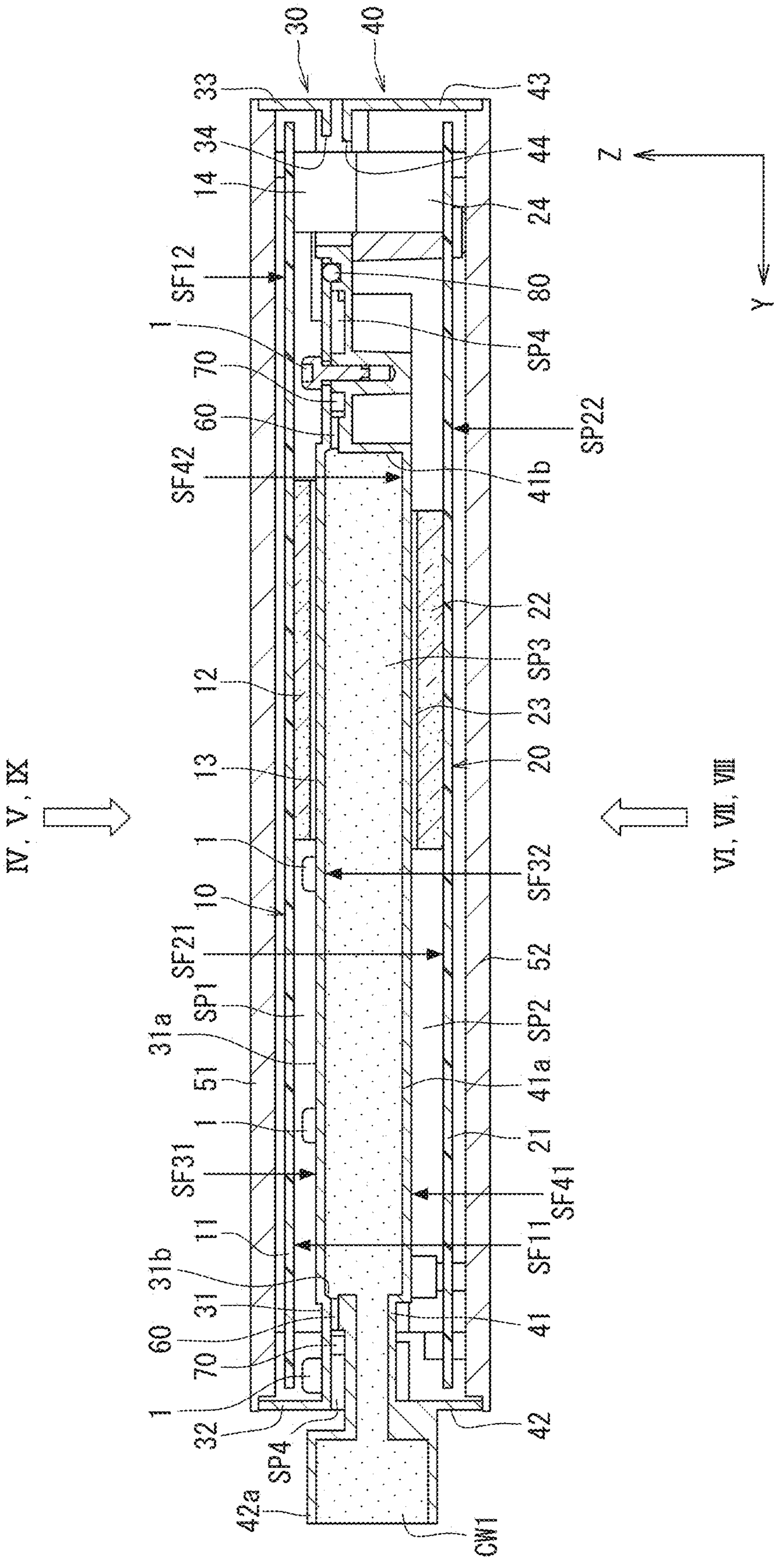
FIG. 2 is a cross-sectional view taken along a line II-II in FIG. 1.
Figure 3:
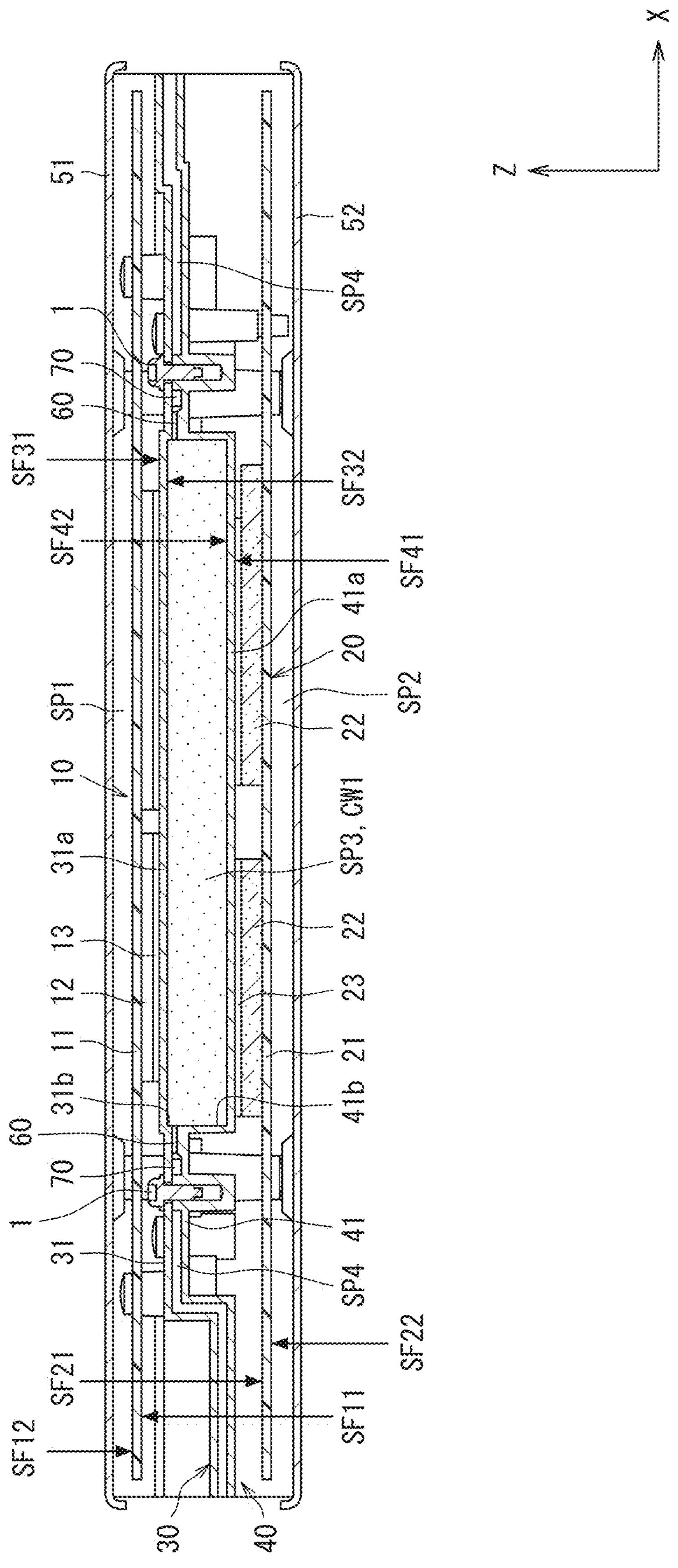
FIG. 3 is a cross-sectional view taken along a line III-III in FIG. 1.

As shown in FIGS. 2 and 3, the first circuit board 10 includes a wiring board 11, a mounting component 12, a heat conduction member 13, a first connector 14, and the like. For example, the wiring board 11 has an electrically insulating base, which is made of a resin or the like, and a conductive wiring, which is made of copper or the like. The wiring board 11 is a so-called printed wiring board. The wiring board 11 has a mounting surface SF11 on which the mounting component 12 is mounted, and a back surface SF12 opposite the mounting surface SF11. The wiring board 11 is disposed along an XY plane.

The mounting component 12 is mounted on the mounting surface SF11. The mounting component 12 is electrically connected to the wiring of the wiring board 11. The mounting component 12 may be a SoC or the like. Therefore, the first circuit board 10 is configured so that the mounting component 12 executes an arithmetic processing. The first circuit board 10 can also be regarded as a single electronic control unit. "SoC" is an abbreviation for System on a Chip.

Circuit components other than the mounting component 12 may be mounted on the wiring board 11. The number of mounting component(s) 12 mounted on the wiring board 11 is not particularly limited. The wiring board 11 may have a circuit component on the back surface SF12.

The mounting component 12 is a circuit component that generates heat when in operation. The mounting component 12 corresponds to a heat generation component. The present embodiment thus employs an example in which the heat conduction member 13 is provided on the mounting component 12. The mounting component 12 is disposed to face a mounting surface SF31 of the first housing member 30, which will be described later. The mounting component 12 is mounted on the first housing member 30 via the heat conduction member 13. The heat conduction member 13 is in contact with the first housing member 30.

The heat conduction member 13 is a member for lowering a thermal resistance between the mounting component 12 and the first housing member 30. The heat conduction member 13 may be a heat dissipation gel or a heat dissipation sheet. The heat conduction member 13 is also referred to as a thermal interface material. The mounting surface SF31 corresponds to an opposite surface.

The first connector 14 is mounted on the mounting surface SF11. The first connector 14 is electrically connected to the wiring of the wiring board 11. The first connector 14 is an interface for electrically connecting the first circuit board 10 and the second circuit board 20.

<Second Circuit Board>

As shown in FIG. 2 and FIG. 3, the second circuit board 20 includes a wiring board 21, a mounting component 22, a heat conduction member 23, a second connector 24, and the like. The second circuit board 20 has a similar structure to the first circuit board 10. In other words, components with the same names but different reference numerals are similar components to the components of the first circuit board 10.

The mounting component 22 is disposed to face a mounting surface SF41 of a second housing member 40, which will be described later. The mounting component 22 is mounted on the second housing member 40 via the heat conduction member 23. The mounting surface SF41 corresponds to an opposite surface.

The second circuit board 20 is electrically connected to the first circuit board 10 due to the second connector 24 and the first connector 14 being connected to each other. The first connector 14 and the second connector 24 can also be regarded as connectors for connecting the boards.

The second circuit board 20 differs from the first circuit board 10 in the number of mounting component(s) 22 and the contents of the arithmetic processing of the mounting component(s) 22. The wiring board 21 has a mounting surface SF21 on which the mounting component 22 is mounted, and a back surface SF22 opposite to the mounting surface SF21. The mounting component 22 corresponds to a heat generation component.

In the present embodiment, the electronic device 100 including the first circuit board 10 and the second circuit board 20 is employed. Alternatively, the electronic device 100 may also be configured to have either the first circuit board 10 or the second circuit board 20. As another example, the electronic device 100 may be configured such that the heat generation component is provided on either the first circuit board 10 or the second circuit board 20. Hereinafter, when there is no need to distinguish between the first circuit board 10 and the second circuit board 20, the first circuit board 10 and the second circuit board 20 will be collectively referred to as the circuit boards 10 and 20.

<Housing>

As shown in FIG. 1, FIG. 2 and FIG. 3, a housing includes a first housing member 30 and a second housing member 40. The housing also includes a first cover 51, a second cover 52, a third cover 53, and a fourth cover 54. The housing is formed by assembling the first housing member 30, the second housing member 40, the first cover 51, the second cover 52, the third cover 53, and the fourth cover 54.

Figure 4:
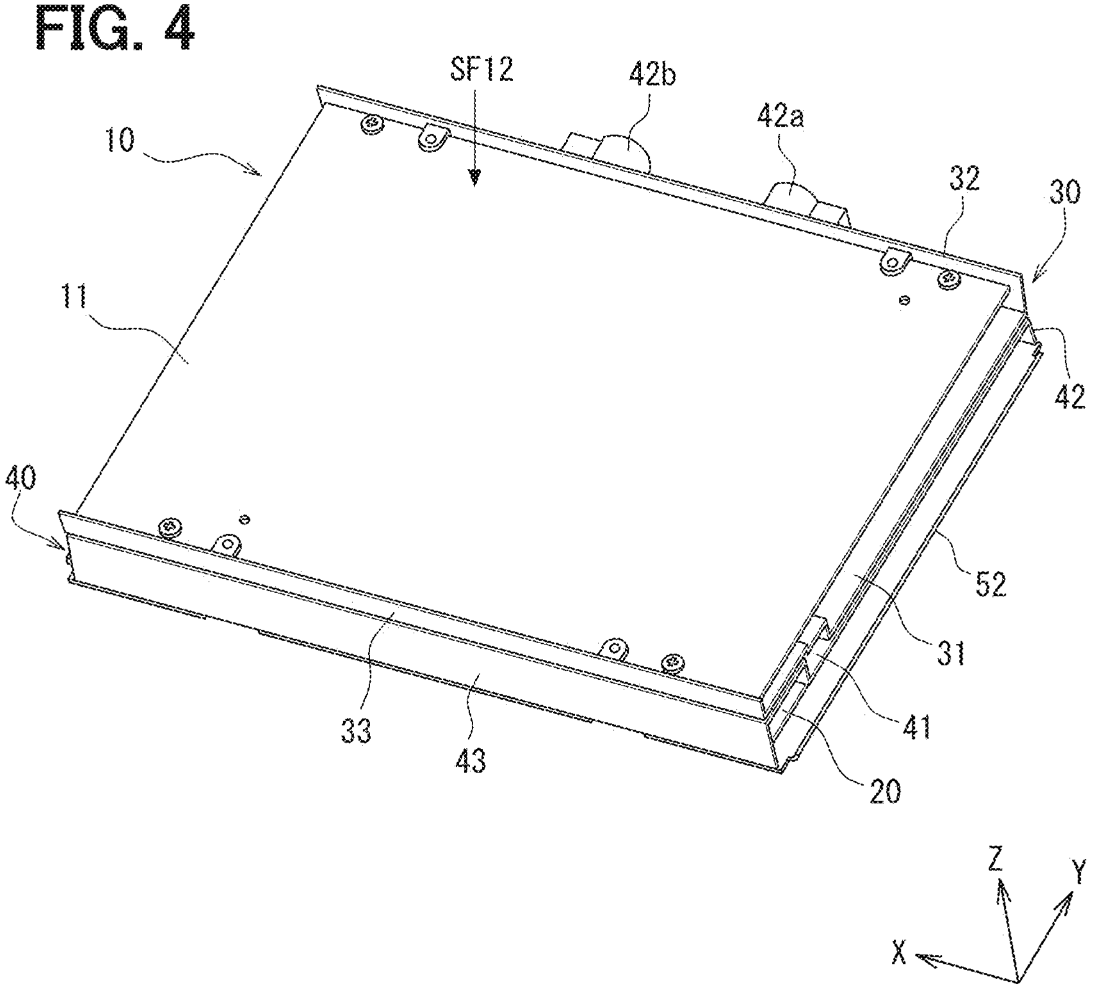
FIG. 4 is a perspective view showing a schematic configuration on a first circuit board side of the electronic device.

First, the first housing member 30 will be described with reference to FIG. 2 to FIG. 6. As shown in FIG. 2, FIG. 3 and FIG. 4, the first housing member 30 is a member that houses the first circuit board 10. The first housing member 30 can also be regarded as a member on which the first circuit board 10 is mounted. Therefore, the first housing member 30 can also be referred to as a mount member or a first mount member.

Figure 5:
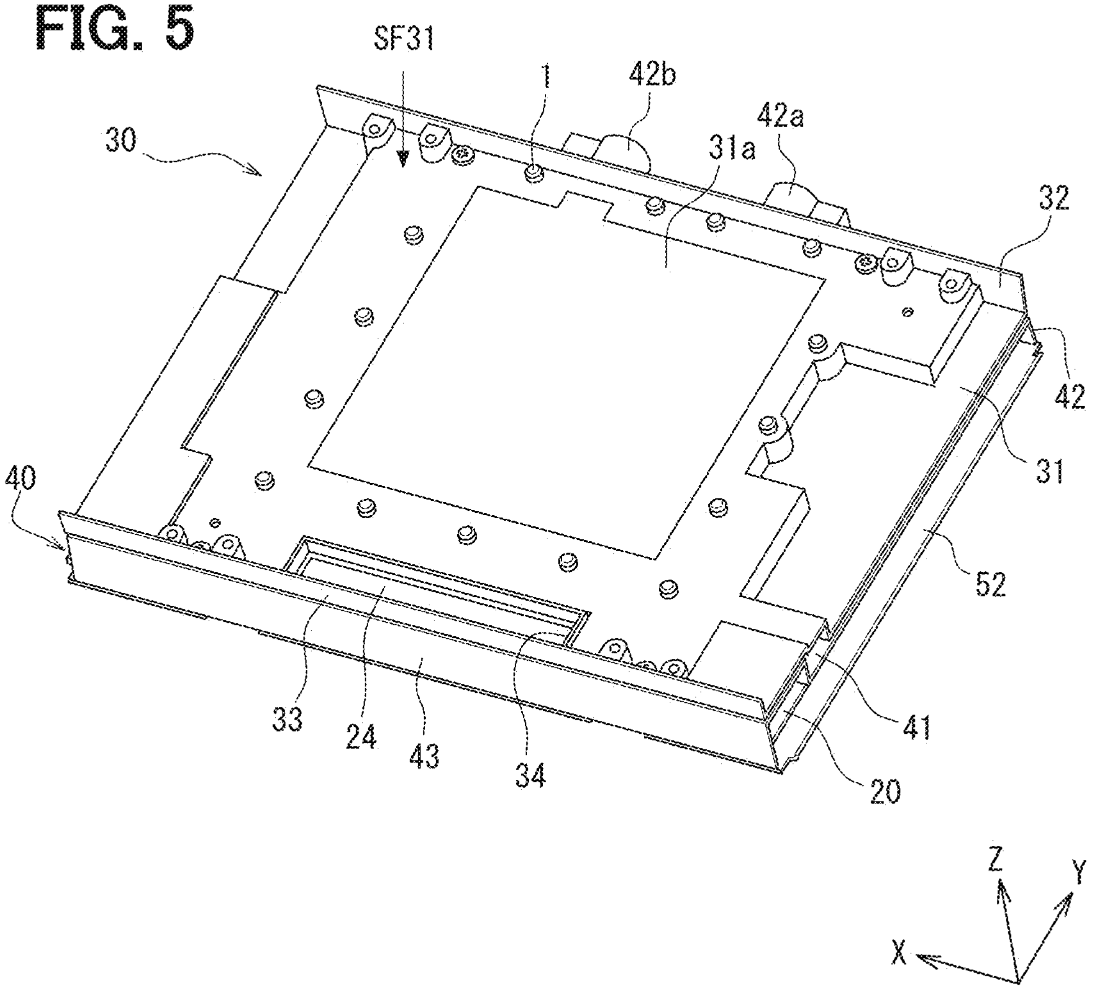
FIG. 5 is a perspective view showing a schematic configuration on a mounting surface side of a first housing member of the electronic device.
Figure 6:
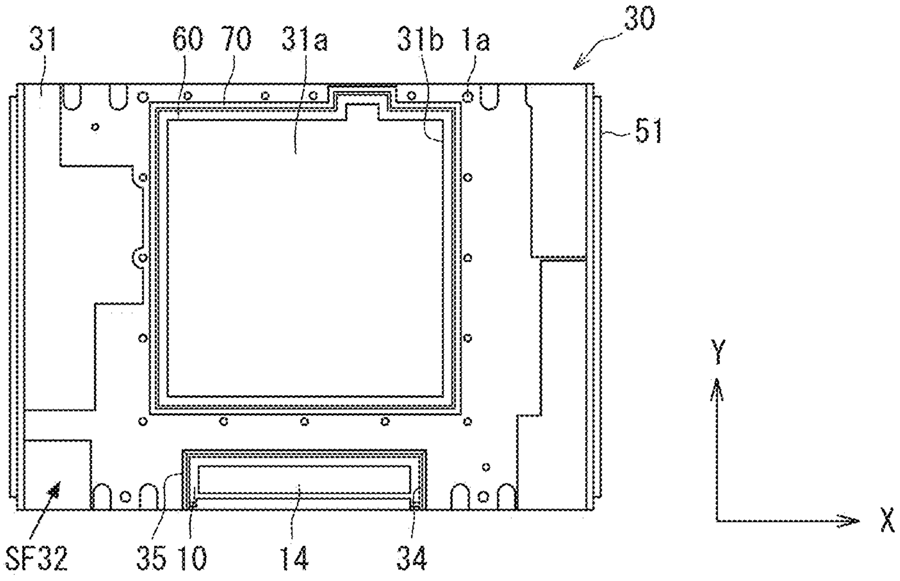
FIG. 6 is a perspective view showing a schematic configuration on a facing surface side of the first housing member.

As shown in FIG. 5 and FIG. 6, the first housing member 30 includes a base portion 31 and side walls 32 and 33. The base portion 31 has a mounting surface SF31 on which the first circuit board 10 is mounted, and a facing surface SF32 opposite to the mounting surface SF31. The facing surface SF32 is a surface that faces the second housing member 40 when the first housing member 30 and the second housing member 40 are assembled together.

The side walls 32 and 33 are disposed at opposite ends of the base portion 31 in the Y direction. The side walls 32 and 33 protrude in the Z direction from the base portion 31. The side walls 32 and 33 extend along the X direction. The first housing member 30 has a first housing part SP1 for housing the first circuit board 10 in an area defined between the side wall 32 and the side wall 33. The first housing part SP1 corresponds to a facing area of the mounting surface SF31 and is an area defined between the side wall 32 and the side wall 33.

In a state where the first circuit board 10 is housed in the first housing member 30, the mounting surface SF11 of the first circuit board 10 faces the mounting surface SF31 of the first housing member 30. On the other hand, the back surface SF12 is exposed. Therefore, the first cover 51 is attached to the first housing member 30 in the facing area of the mounting surface SF31. In other words, the first cover 51 is attached to the first housing member 30 so as to cover the back surface SF12.

The third cover 53 and the fourth cover 54 are attached to the ends of the base portion 31 of the first housing member 30 along the Y direction. As another example, the first housing member 30 may be provided with side walls at the ends in the X direction so as to surround the first circuit board 10 together with the side walls 32 and 33. As further another example, the first housing member 30 may be provided with a side wall only on one of the ends in the X direction.

The base portion 31 includes a cooling section 31*a*. The cooling section 31*a* is a part that forms a hollow part SP3, which will be described later. The facing surface SF32 of the cooling section 31*a* is formed with a first recess 31*b* that is recessed more than its peripheral area. The facing surface SF32 of the cooling section 31*a* is a portion that comes into contact with the cooling water CW1. The first recess 31*b* corresponds to a recessed portion.

As shown in FIG. 2, FIG. 5, FIG. 6 and the like, the base portion 31 is formed with a first opening 34. The first opening 34 is a through hole that passes from the mounting surface SF31 to the facing surface SF32. The first opening 34 is disposed at a position closer to the side wall 33 than the side wall 32. The first connector 14 and the second connector 24, which are connected to each other, are partly disposed in the first opening 34.

As shown in FIG. 6, the base portion 31 is provided with a sealing portion 35 around the first opening 34. The sealing portion 35 is provided on the facing surface SF32. The sealing portion 35 is a portion in which a connector sealing member 80 is arranged, as will be described later. As an example, the sealing portion 35 has a groove shape to receive the connector sealing member 80 therein.

Figure 7:
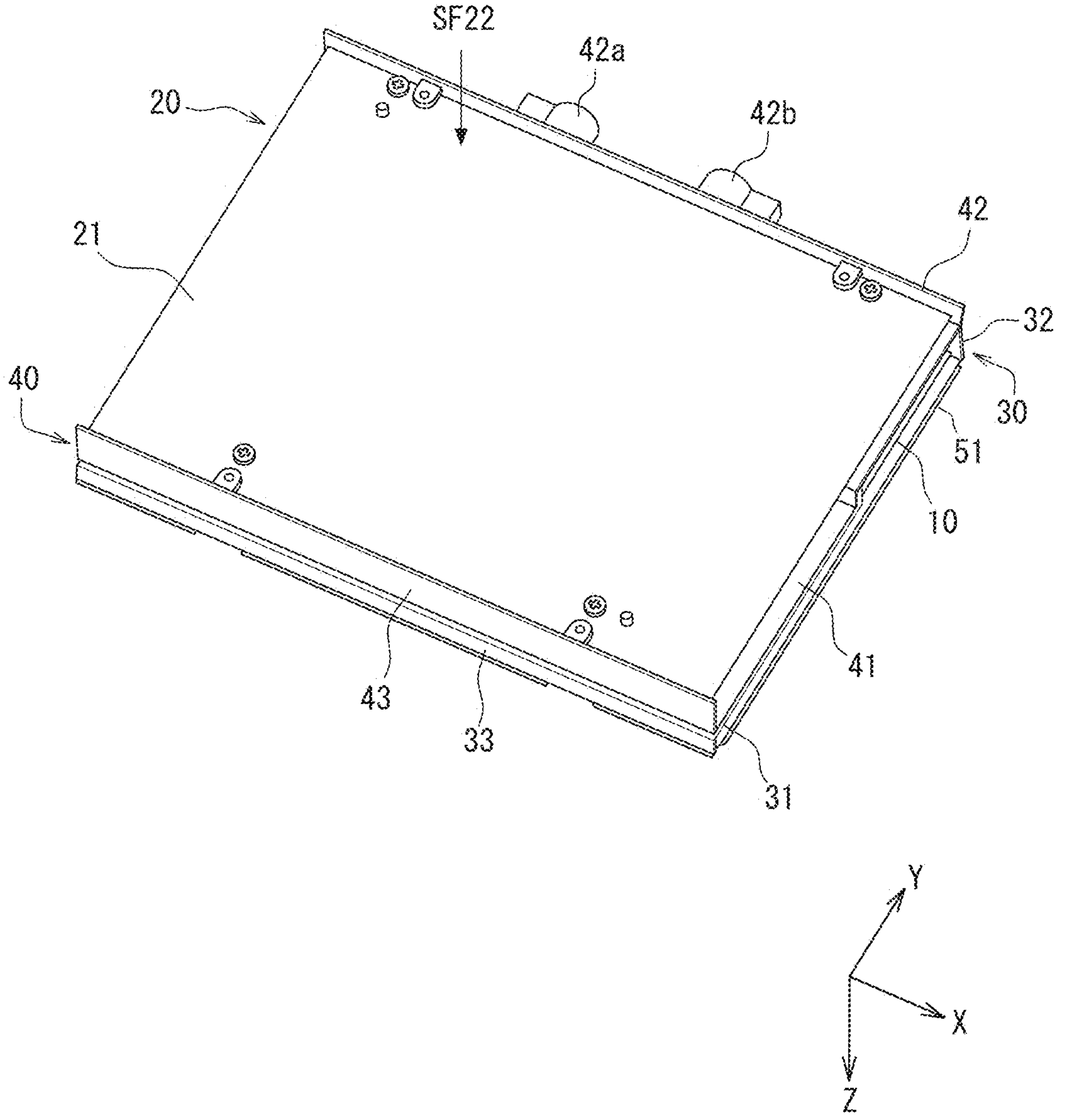
FIG. 7 is a perspective view showing a schematic configuration on a second circuit board side of the electronic device.

Next, the second housing member 40 will be described with reference to FIG. 2, FIG. 3, and FIG. 7 to FIG. 9. As shown in FIG. 2, FIG. 3 and FIG. 7, the second housing member 40 is a member that houses the second circuit board 20. The second housing member 40 can also be regarded as a member on which the second circuit board 20 is mounted. Therefore, the second housing member 40 can also be referred to as a mount member or a second mount member.

Figure 8:
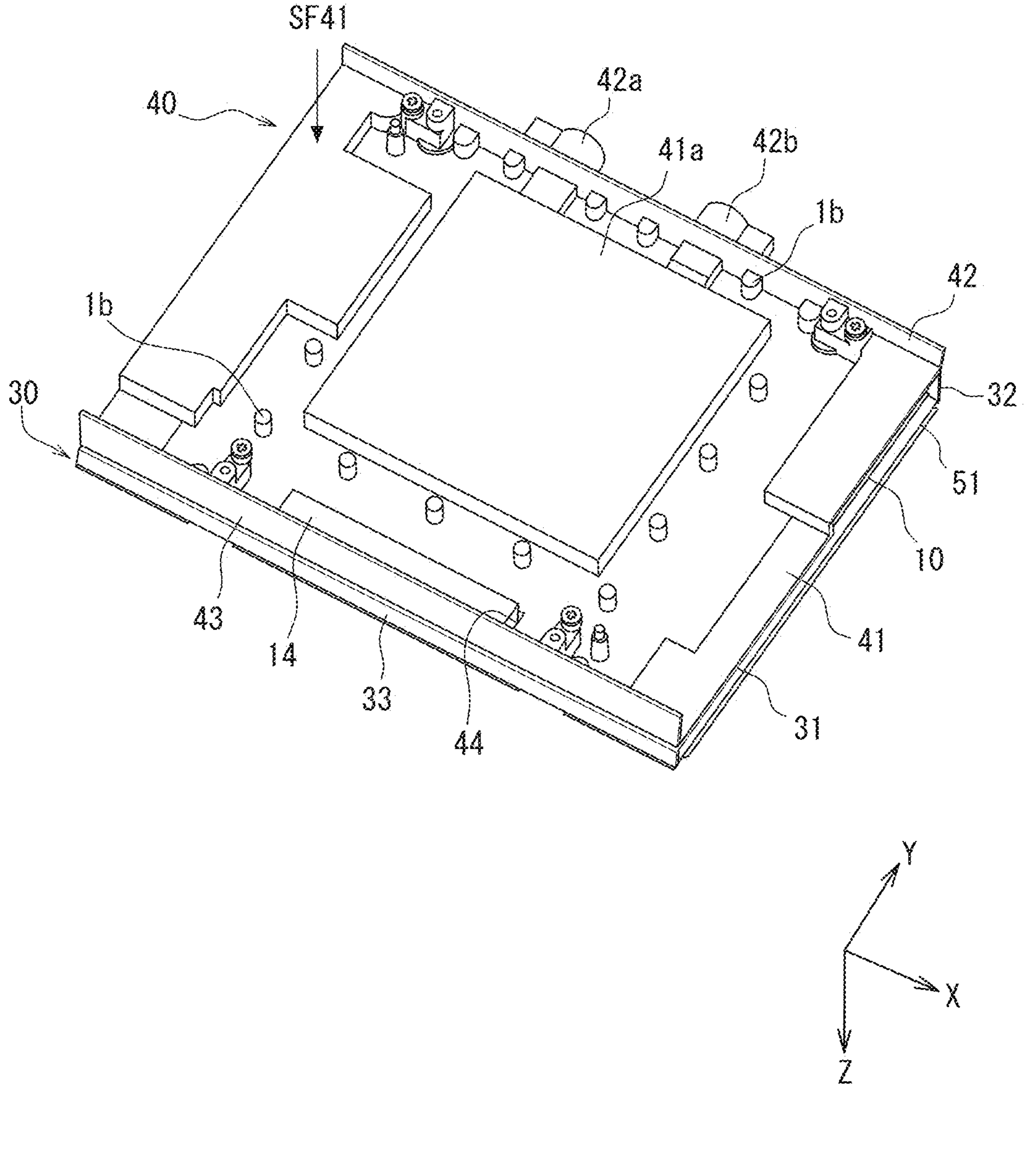
FIG. 8 is a perspective view showing a schematic configuration on a mounting surface side of a second housing member of the electronic device.

As shown in FIG. 7 and FIG. 8, the second housing member 40 includes a base portion 41 and side walls 42 and 43. The base portion 41 has a mounting surface SF41 on which the second circuit board 20 is mounted, and a facing surface SF42 opposite to the mounting surface SF41. The facing surface SF42 is a surface that faces the first housing member 30 when the first housing member 30 and the second housing member 40 are assembled together.

The side walls 42 and 43 are disposed at opposite ends of the base portion 41 in the Y direction. The side walls 42 and 43 protrude in the Z direction from the base portion 41. The side walls 42 and 43 extend along the X direction. The second housing member 40 has a second housing part SP2 for housing the second circuit board 20 in an area defined between the side wall 42 and the side wall 43. The second housing part SP2 corresponds to a facing area of the mounting surface SF41 and is an area defined between the side wall 42 and the side wall 43.

In a state where the second circuit board 20 is housed in the second housing member 40, the mounting surface SF21 of the second circuit board 20 faces the mounting surface SF41 of the second housing member 40. On the other hand, the back surface SF22 is exposed. Therefore, the second cover 52 is attached to the second housing member 40 in the facing area of the mounting surface SF41. In other words, the second cover 52 is attached to the second housing member 40 so as to cover the back surface SF22.

The third cover 53 and the fourth cover 54 are attached to the ends of the base portion 41 of the second housing member 40 along the Y direction. In this manner, the third cover 53 and the fourth cover 54 are provided to be shared between the first housing member 30 and the second housing member 40. Alternatively, in the present disclosure, the housing may not have the third cover 53 and the fourth cover 54. For example, electrical components such as external connection connectors may be attached in place of the third cover 53 and the fourth cover 54.

The second housing member 40 may be provided with side walls at the ends in the X direction to surround the second circuit board 20 together with the side wall 42 and the side wall 43. As another example, the second housing member 40 may be provided with a side wall only on one end in the X direction.

The base portion 41 includes a cooling section 41*a*. The cooling section 41*a* is a part that forms the hollow part SP3, which will be described later. In other words, the cooling section 41*a* is a part that forms the hollow part SP3 together with the cooling section 31*a*. The facing surface SF42 of the cooling section 41*a* is formed with a second recess 41*b* that is recessed from its peripheral area. The facing surface SF42 of the cooling section 41*a* is a portion that comes into contact with the cooling water CW1. The second recess 41*b* corresponds to a recessed portion.

In this manner, the hollow part SP3 is provided by the first recess 31*b* and the second recess 41*b* facing each other. Therefore, the electronic device 100 can have the hollow part SP3 that is larger than a hollow part in which either the first recess 31*b* or the second recess 41*b* is formed by a flat surface. For this reason, the electronic device 100 can increase the amount of the cooling water CW1. Accordingly, the electronic device 100 can efficiently cool the circuit board.

Figure 9:
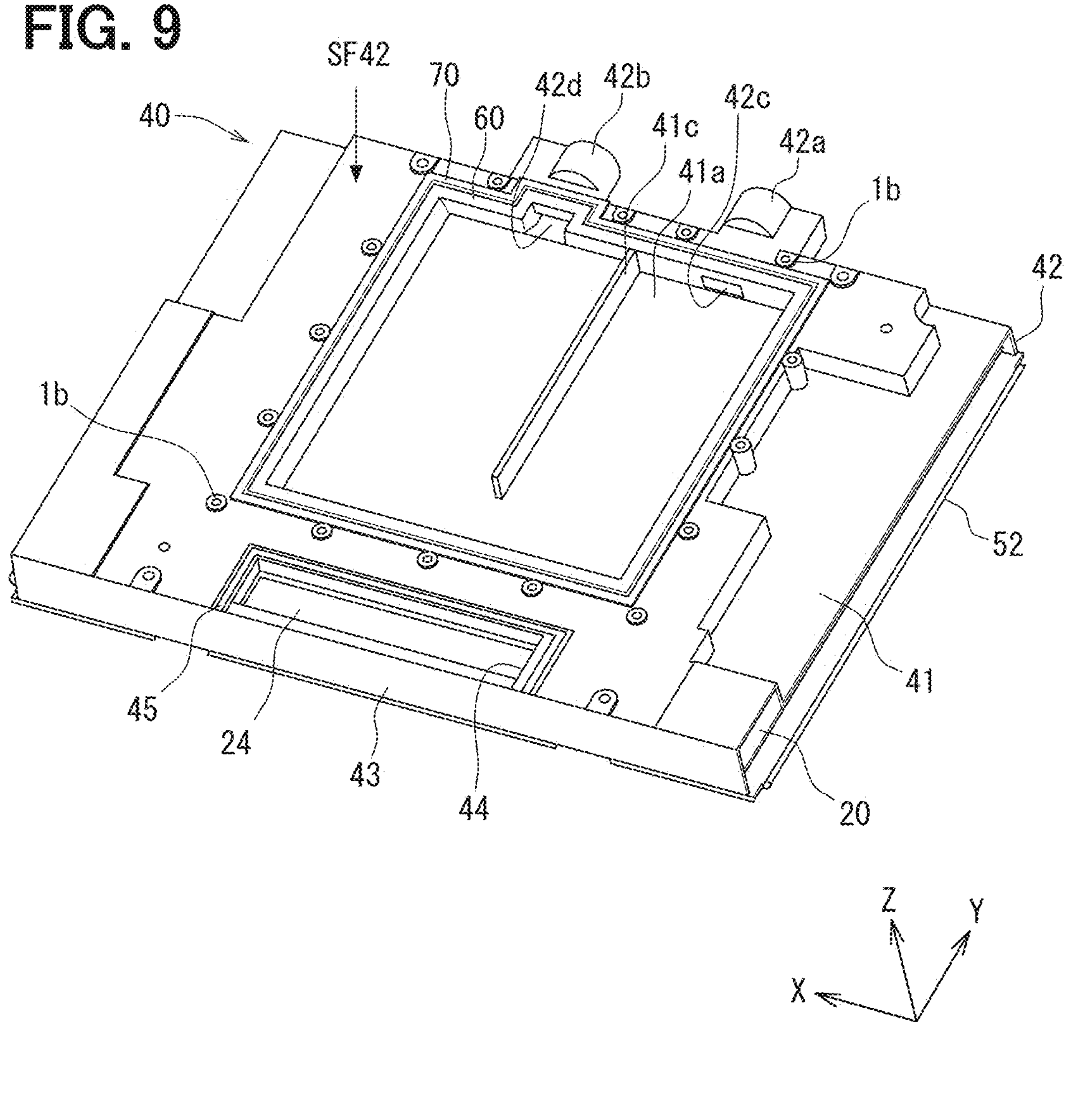
FIG. 9 is a perspective view showing a schematic configuration on a facing surface side of the second housing member.

As shown in FIG. 2, FIG. 8, FIG. 9 and the like, the base portion 41 is formed with a second opening 44. The second opening 44 is a through hole that passes from the mounting surface SF41 to the facing surface SF42. The second opening 44 is disposed at a position closer to the side wall 43 than the side wall 42. The first connector 14 and the second connector 24, which are connected to each other, are partly disposed in the second opening 44.

As shown in FIG. 9, the base portion 41 has a sealing portion 45 provided around the second opening 44. The sealing portion 45 is disposed on the facing surface SF42. The sealing portion 45 is a portion in which the connector sealing member 80 is disposed, as will be described later. As an example, the sealing portion 45 has a groove shape to receive the connector sealing member 80 therein.

As shown in FIG. 9, an outlet portion 42*a* and an inlet portion 42*b* are provided to be continuous with the side wall 42. The outlet portion 42*a* and the inlet portion 42*b* are provided integrally with the side wall 42. Therefore, it can be said that the outlet portion 42*a* and the inlet portion 42*b* are provided adjacent to each other on the same side wall 42.

The outlet portion 42*a* is a portion to which an outlet pipe through which the cooling water CW1 flows is attached. The outlet portion 42*a* is formed with an outlet port 42*c* which is a through hole in communication with the hollow part SP3. The cooling water CW1 flowing through the hollow part SP3 passes through the outlet port 42*c* and flows out to the outlet pipe.

The inlet portion 42*b* is a portion to which an inlet pipe through which the cooling water CW1 flows is attached. The inlet portion 42*b* is formed with an inlet port 42*d* which is a through hole in communication with the hollow part SP3. The cooling water CW1 is supplied into the hollow part SP3 from the inlet pipe through the inlet port 42*d*.

The second housing member 40 has a wall portion 41*c* that protrudes into the hollow part SP3. The wall portion 41*c* is a portion of the cooling portion 41*a* that protrudes toward the facing surface SF42. The wall portion 41*c* has a height, for example, approximately equal to the depth of the second recess 41*b*. Alternatively, the wall portion 41*c* may have a height approximately equal to the depth of the hollow part SP3 in the Z direction. The height of the wall portion 41*c* is the dimension in the Z direction. The length or depth of the hollow part SP3 corresponds to the distance between the facing surface SF32 and the facing surface SF42 in the hollow part SP3.

The wall portion 41*c* is disposed between the outlet port 42*c* and the inlet port 42*d*. In other words, the wall portion 41*c* is connected to a wall defining the second recess 41*b* adjacent to the side wall 42, between the outlet port 42*c* and the inlet port 42*d*. The wall portion 41*c* is disposed along the Y direction without reaching a wall defining the second recess 41*b* adjacent to the side wall 43. In this manner, the wall portion 41*c* partially divides the hollow part SP3 into an outlet port 42*c* side and an inlet port 42*d* side. This wall portion 41*c* may be provided on at least one of the first housing member 30 or the second housing member 40. The wall portion 41*c* can also be referred to as a flow adjusting portion or a flow adjusting wall that adjusts or rectifies the flow of the liquid refrigerant.

The outlet port 42*c* and the inlet port 42*d* correspond to an inlet/outlet port. The outlet pipe and the inlet pipe correspond to pipes. The outlet pipe can also be regarded as a pipe attached to the outlet port 42*c*. The inlet pipe can also be regarded as a pipe attached to the inlet port 42*d*.

In the present embodiment, as an example, a configuration in which the outlet portion 42*a* and the inlet portion 42*b* are provided in the second housing member 40 is employed. Alternatively, the outlet portion 42*a* and the inlet portion 42*b* may be provided in the first housing member 30. As further another example, the outlet portion 42*a* may be provided in one of the first housing member 30 or the second housing member 40, and the inlet portion 42*b* may be provided in the other.

One of the outlet portion 42*a* and the inlet portion 42*b* may be provided on the side wall 42, and the other may be provided on the side wall 43. In other words, the electronic device 100 may be configured so that the coolant CW1 flows linearly.

Thus, the electronic device 100 has, as a housing part, a first housing part SP1 and a second housing part SP2. The first housing member 30 and the second housing member 40 are provided with the housing part SP1 and the housing part SP2.

Therefore, the first housing member 30 and the second housing member 40 correspond to an accommodation housing member. However, the present disclosure can also be adopted in a configuration in which the housing parts SP1 and SP2 are provided in at least one of the first housing member 30 or the second housing member 40.

The first housing member 30 and the second housing member 40 are mainly made of a metal such as aluminum. However, the material of the first housing member 30 and the second housing member 40 is not limited to such an example. Only one of the first housing member 30 or the second housing member 40 may be made of a metal as a main component. For example, the first housing member 30 and/or the second housing member 40 may be made of a material mainly composed of a resin.

<Electronic Device>

Here, assembling of the components as described above and the electronic device 100 in the assembled state will be described.

Figure 10:
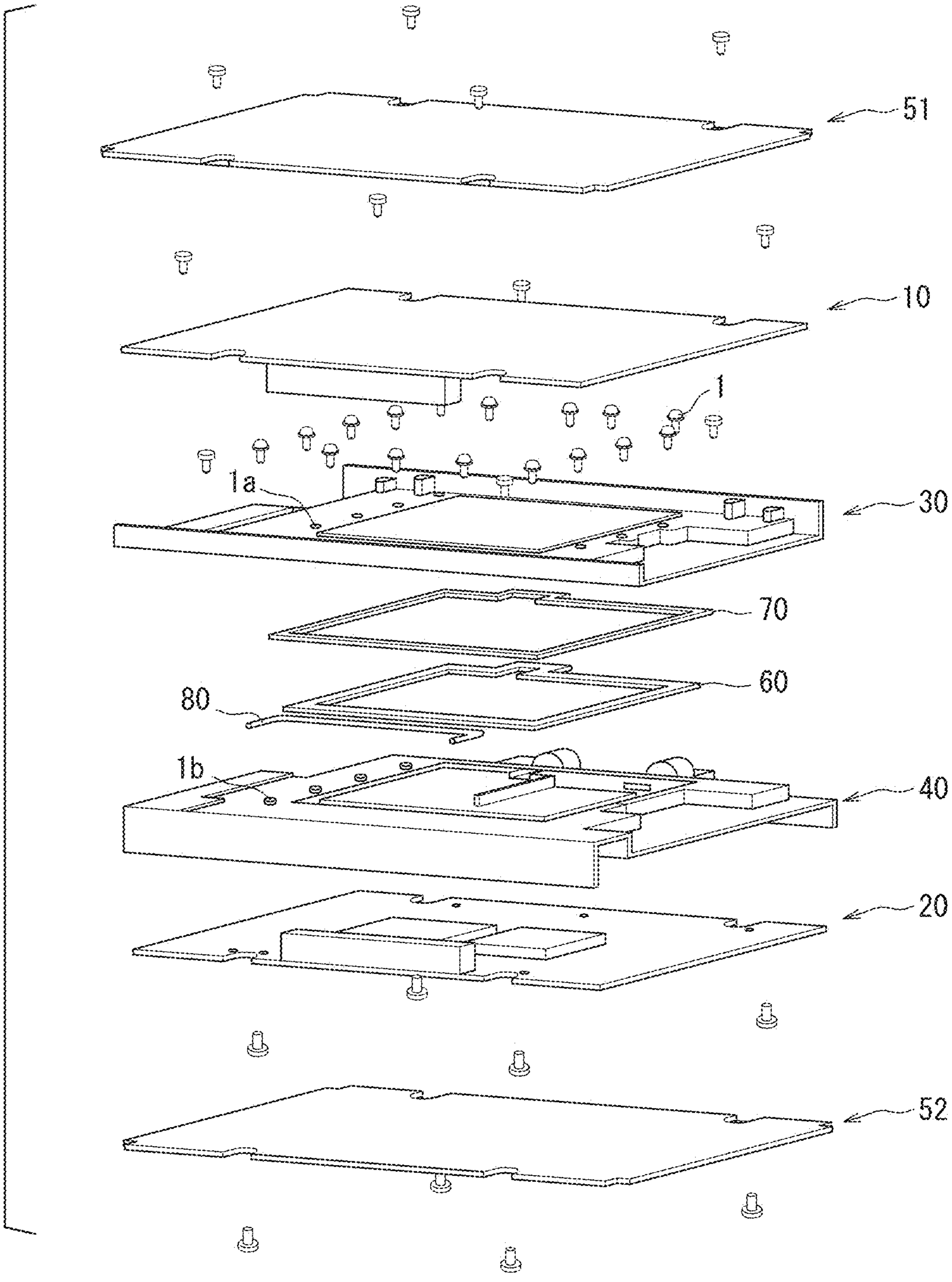
FIG. 10 is an exploded perspective view showing a schematic configuration of the electronic device.

As shown in FIG. 10, the electronic device 100 includes the first circuit board 10, the second circuit board 20, the first housing member 30, the second housing member 40, the first cover 51, and the second cover 52 as separate components. Further, the electronic device 100 includes the sealing member 60, a gasket 70, and the connector sealing member 80 as separate components.

The electronic device 100 is formed by stacking and assembling these components. The electronic device 100 is assembled such that the facing surface SF32 of the first housing member 30 and the facing surface SF42 of the second housing member 40 face each other. The first housing member 30 and the second housing member 40 are fixed together by screw members 1, which are male screws. As shown in FIG. 6, the first housing member 30 is formed with screw openings 1*a* into which the screw members 1 are inserted. On the other hand, the second housing member 40 is formed with screw holes 1*b* into which the screw members 1 are fastened, as shown in FIG. 9. The screw holes 1*b* are formed with female threads. The first housing member 30 and the second housing member 40 are fixed together by fastening the screw members 1 to the screw holes 1*b* while passing through the screw openings 1*a*.

Further, when the first housing member 30 and the second housing member 40 are assembled together, the hollow part SP3 is formed by the facing surfaces SF32 and SF42. The hollow part SP3 provides a space through which the cooling water CW1 flows. Therefore, the hollow part SP3 can also be regarded as a refrigerant flow path.

As shown in FIG. 2, FIG. 3, FIG. 6 and FIG. 9, the sealing member 60 is provided between the first housing member 30 and the second housing member 40 so as to surround the entire perimeter of the hollow part SP3. It can also be said that the sealing member 60 is provided in the facing region between the first housing member 30 and the second housing member 40. That is, the first housing member 30 and the second housing member 40 are fixed together in the state where the sealing member 60 is disposed in the facing region.

The sealing member 60 restricts the cooling water CW1 from leaking from the hollow part SP3. The sealing member 60 may be provided by an O-ring, a caulking material, or the like.

The sealing member 60 is in contact with the first housing member 30 and the second housing member 40. More specifically, the sealing member 60 is in contact with the facing surfaces SF32 and SF42. Furthermore, the sealing member 60 is arranged in a pressed stated by the facing surfaces SF32 and SF42 due to the screw members 1 being fixed as described above. As such, the electronic device 100 restricts the leakage of the cooling water CW1 from the hollow part SP3.

As shown in FIG. 6 and FIG. 9, the screw members 1 are provided at multiple locations on the outer periphery of the sealing member 60. In other words, the screw members 1 are disposed at multiple locations so as to surround the sealing member 60. The screw members 1 are disposed at multiple locations on each side of the sealing member 60 along the Y direction. The screw members 1 are disposed at multiple locations on each side of the sealing member 60 along the X direction. The screw members 1 are disposed at two locations on opposite sides of the outlet port 42*c* and at two locations on opposite sides of the inlet port 42*d*.

In the electronic device 100, therefore, the first housing member 30 and the second housing member 40 can press the sealing member 60 along its entire periphery, improving the sealing performance. In other words, the electronic device 100 can improve the function of suppressing the leakage by the sealing member 60.

Note that the electronic device 100 may not have the sealing member 60. For example, the first housing member 30 and the second housing member 40 are welded together so as to surround the entire perimeter of the hollow part SP3. Also in this case, it is possible to restrict the leakage of the cooling water CW1 from the hollow part SP3.

As shown in FIG. 2, FIG. 3, FIG. 6 and FIG. 9, the gasket 70 is provided in the facing region between the first housing member 30 and the second housing member 40. The gasket 70 is disposed to surround entirely the periphery of the sealing member 60. It can also be said that the gasket 70 is disposed on the outer periphery of the sealing member 60. In other words, the first housing member 30 and the second housing member 40 are fixed together in the state where the gasket 70 is disposed in the facing region.

As described above, the electronic device 100 includes the sealing member 60 for restricting the leakage of the cooling water CW1 from the hollow part SP3. However, the cooling water CW1 may leak due to deterioration or the like of the sealing member 60. The gasket 70 is a member for restricting the leaking cooling water CW1 from scattering forcefully even if the cooling water CW1 leaks. The gasket 70 corresponds to a scatter restriction member.

The material of the gasket 70 is not particularly limited. It is preferable that the gasket 70 is in contact with both of the facing surfaces SF32 and SF42. Alternatively, it is sufficient that the gasket 70 is in contact with at least one of the facing surface SF32 or the facing surface SF42. Also, the gasket 70 may be employed in a portion protruding from at least one of the facing surface SF32 or the facing surface SF42.

As a result, even if the cooling water CW1 leaks from the hollow part SP3, the electronic device 100 can restricts the leaked liquid cooling water CW1 from flowing out forcefully. The screw members 1 may be disposed at multiple locations on the outer periphery of the gasket 70. Alternatively, the electronic device 100 may not have the gasket 70.

As described above, the second housing member 40 has the wall portion 41*c*. Therefore, in the state where the first housing member 30 and the second housing member 40 are assembled together, the wall portion 41*c* is disposed in the hollow part SP3. The wall portion 41*c* allows the cooling water CW1 to flow in a U-shape within the hollow part SP3. Therefore, the electronic device 100 can be configured so that the cooling water CW1 can easily flow throughout the entire hollow part SP3.

More specifically, in the present embodiment, as an example, the inlet port 42*d* and the outlet port 42*c* are provided adjacent to one side wall 42. Therefore, the cooling water CW1 flows into the hollow part SP3 from the inlet port 42*d*, flows throughout the entire hollow part SP3, and thus easily flows out from the outlet port 42*c*. As such, it is possible to restrict the cooling water CW1 from stagnating partly in the hollow part SP3. With this, the electronic device 100 can have a larger cooling space. However, the electronic device 100 may not have the wall portion 41*c*.

As shown in FIG. 2 and FIG. 3, a gap SP4 that communicates with the external space is provided on the outer periphery of the sealing member 60 between the facing surfaces SF32 and SF42. In other words, in the electronic device 100, the facing surface SF32 and the facing surface SF42 are not in contact with each other on the outer periphery of the sealing member 60 in the state where the first housing member 30 and the second housing member 40 are assembled together. The gap SP4 can be regarded as a facing region defined between the facing surface SF32 and the facing surface SF42 on the periphery of the sealing member 60.

Note that the external space is a space in which the electronic device 100 is placed. The external space can also be regarded as the space surrounding the electronic device 100. As such, the electronic device 100 allows the cooling water CW1 to be released to the external space even if the cooling water CW1 leaks from the hollow part SP3. Alternatively, the electronic device 100 may not have the gap SP4. As another example, the gap SP4 may be provided only in a part on the periphery of the sealing member 60.

The connector sealing member 80 is provided between the first housing member 30 and the second housing member 40 around the first opening 34 and the second opening 44. That is, the first housing member 30 and the second housing member 40 are fixed together in a state where the connector sealing member 80 is disposed in the sealing portions 35 and 45.

The connector sealing member 80 is in contact with the sealing portions 35 and 45. More specifically, the connector sealing member 80 is disposed in a pressed state by the sealing portions 35 and 45, as the screw members 1 being fixed. Therefore, the electronic device 100 can restrict the first connector 14 and the second connector 24 from being wet even if the cooling water CW1 leaks from the hollow part SP3.

In this manner, the base part of the housing having the hollow part SP3 and the gap SP4 is formed by fixing the first housing member 30 and the second housing member 40 with the screw members 1. As shown in FIG. 4, FIG. 7 and the like, the first circuit board 10 and the second circuit board 20 are mounted on the base part. In other words, the first circuit board 10 is mounted on the first housing member 30. The second circuit board 20 is mounted on the second housing member 40. The housing members 30 and 40 and the circuit boards 10 and 20 are fixed together by screws or the like.

As a result, as shown in FIG. 2 and FIG. 3, the first circuit board 10 and the second circuit board 20 are fixed so as to interpose the base portion 31 of the first housing member 30 and the base portion 41 of the second housing member 40 therebetween. Further, the cooling sections 31*a* and 41*a* are disposed between the first circuit board 10 and the second circuit board 20. The hollow part SP3 is thus provided between the first circuit board 10 and the second circuit board 20. Therefore, the electronic device 100 can cool the first circuit board 10 and the second circuit board 20 by the cooling water CW1 flowing through the single hollow part SP3. In other words, the hollow part SP3 can be regarded as a refrigerant space provided in common to the first circuit board 10 and the second circuit board 20.

It is preferable that the circuit boards 10 and 20 are respectively disposed so that the mounting components 12 and 22 face the cooling sections 31*a* and 41*a*. In such a case, the electronic device 100 can efficiently cool the mounting components 12 and 22.

In particular, the electronic device 100 includes the first circuit board 10 and the second circuit board 20. In the electronic device 100, it is conceivable that the number of mounting components 12 and 22 and the calculations performed by the respective mounting components 12 and 22 increase in accordance with the integration of functions. With this, the amount of heat generated by the electronic device 100 may increase. In contrast, the electronic device 100 can cool the first circuit board 10 and the second circuit board 20 with the cooling water CW1. Therefore, the electronic device 100 can operate the first circuit board 10 and the second circuit board 20 at appropriate temperatures. In other words, the electronic device 100 can withstand the increase in the number of mounting components 12 and 22 and the increase in the calculations performed by each of the mounting components 12 and 22. In addition, the electronic device 100 can maintain stable operation even if the number of mounting components 12 and 22 and the amount of calculation of each of the mounting components 12 and 22 increase.

In the present embodiment, as an example, the first housing member 30 and the second housing member 40 are mainly made of a metal. Therefore, the electronic device 100 can improve the cooling effect of the circuit boards 10 and 20 by the cooling water CW1.

However, the present disclosure is not limited to the example described above. Only one of the first housing member 30 or the second housing member 40 may be made of metal as a main component. In a configuration in which a circuit board is mounted on only one of the first housing member 30 or the second housing member 40, it is preferable that the one on which the circuit board is mounted is made of a metal as a main component. In other words, it is preferable that either the first housing member 30 or the second housing member 40 in which the housing part SP1 or SP2 is formed is made of a metal as a main component. In such a case, the electronic device 100 can improve the cooling effect of the circuit board by the cooling water CW1.

The first housing member 30 has the two side walls 32 and 33 that define the first housing part SP1 therebetween. Similarly, the second housing member 40 has the two side walls 42 and 43 that define the second housing part SP2 therebetween. With such configurations, the electronic device 100 can further suppress the cooling water CW1 from entering the housing parts SP1 and SP2 even if the cooling water CW1 leaks from the hollow part SP3.

Meanwhile, pipes through which the cooling water CW1 flows are attached to the outlet portion 42*a* and the inlet portion 42*b*. Therefore, there is a possibility that the cooling water CW1 may flow out from the attachment portions between the outlet portion 42*a* and the inlet portion 42*b* and the pipes.

However, as shown in FIG. 2, FIG. 7 and the like, the second housing member 40 has the side wall 42 between the second housing part SP2 and the outlet portion 42*a* and the inlet portion 42*b*. Similarly, as shown in FIG. 2, FIG. 4 and the like, the first housing member 30 has the side wall 32 between the first storage portion SP1 and the outlet portion 42*a* and the inlet portion 42*b*. In other words, the side wall 32 separates the outlet portion 42*a* and the inlet portion 42*b* from the first housing part SP1. The side wall 42 divides the outlet portion 42*a* and the inlet portion 42*b* from the second housing part SP2. Therefore, the electronic device 100 can restrict the cooling water CW1 leaking from the attachment portions between the outlet portion 42*a* and the inlet portion 42*b* and the pipes from reaching the circuit boards 10 and 20.

Advantageous Effects

As described above, in the electronic device 100, the housing parts SP1 and SP2 in which the circuit boards 10 and 20 are housed are separated from the hollow part SP3 through which the cooling water CW1 flows by the first and second housing members 30 and 40, respectively. In other words, the housing parts SP1 and SP2 are separated from the hollow part SP3 by at least the base portions 31 and 41. Further, the housing parts SP1 and SP2 and the hollow section SP3 are separate spaces from each other.

Therefore, even if the cooling water CW1 leaks from the hollow part SP3, the electronic device 100 can restrict the cooling water CW1 from entering the housing parts SP1 and SP2. In other words, the electronic device 100 can restrict the circuit boards 10 and 20 from being wet.

Second Embodiment

An electronic device 101 of a second embodiment and modifications thereof will be described with reference to FIGS. 11 to 25. Some parts of the electronic device 101 are similar to those in the electronic device 100 of the first embodiment. In the following, therefore, parts of the electronic device 101 different from the electronic device 100 will be mainly described. In addition, the electronic device 101 can adopt the configuration of the electronic device 100 as appropriate.

In the electronic device 101, the configuration of the first housing member 30 and the second housing member 40 around the connector 14 is different. The electronic device 101 includes water protection sections 36 and 46 instead of the connector sealing member 80.

Figure 11:
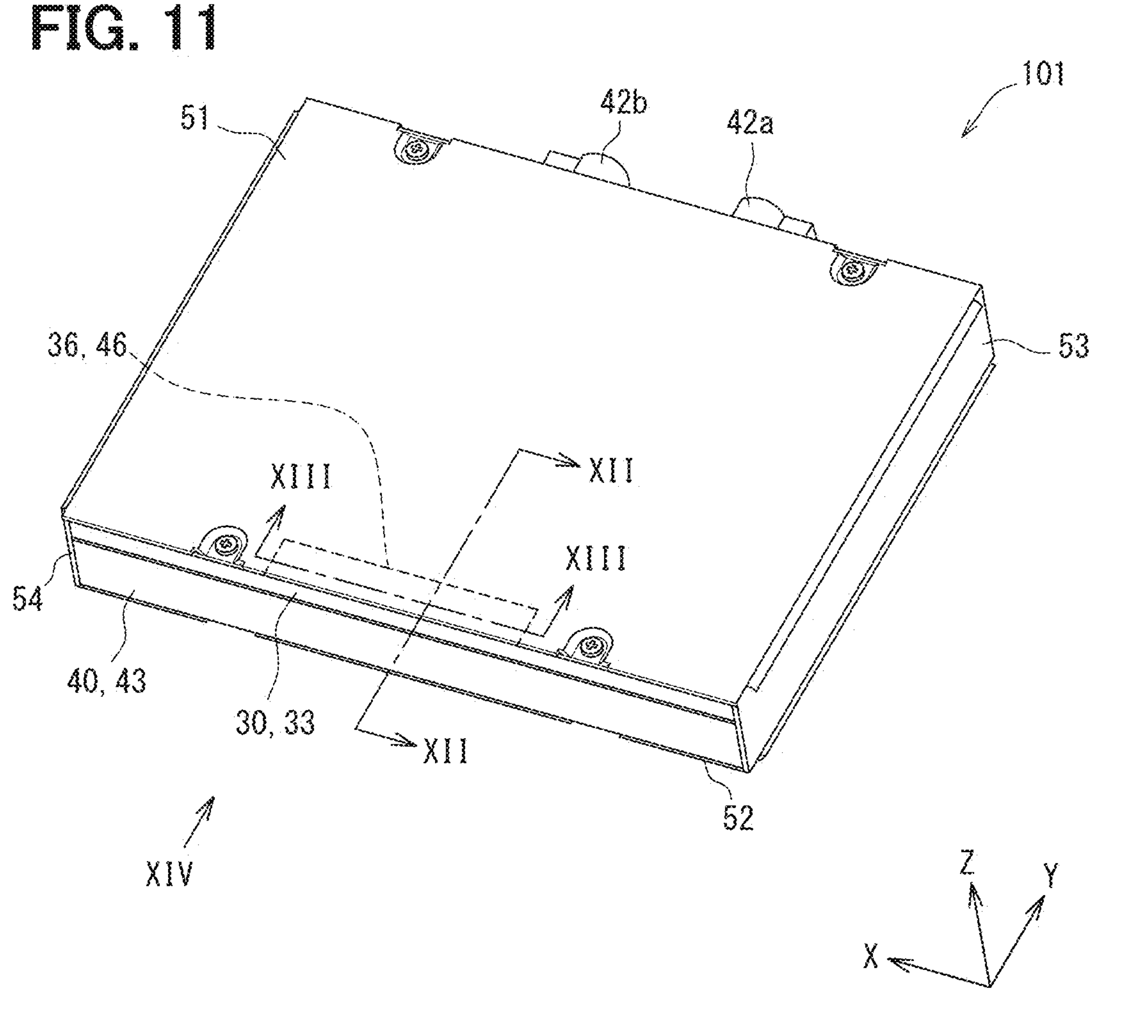
FIG. 11 is a perspective view showing a schematic configuration of an electronic device according to a second embodiment.
Figure 12:
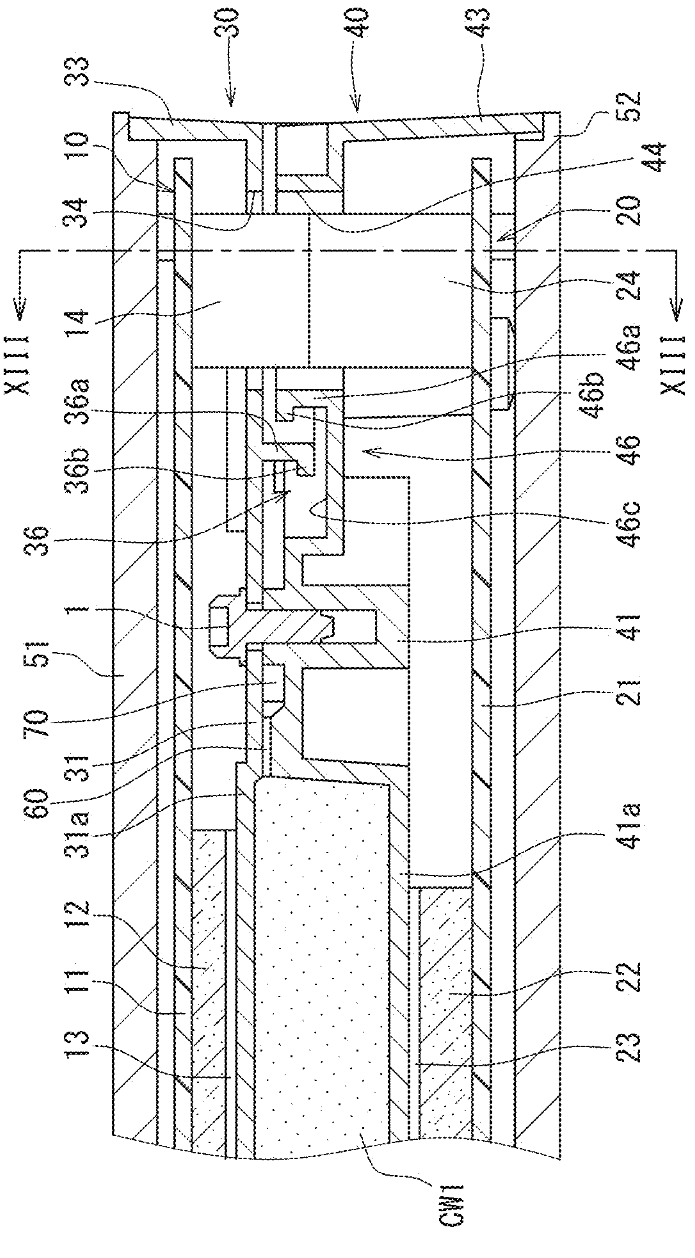
FIG. 12 is a cross-sectional view taken along a line XII-XII in FIG. 11.
Figure 13:
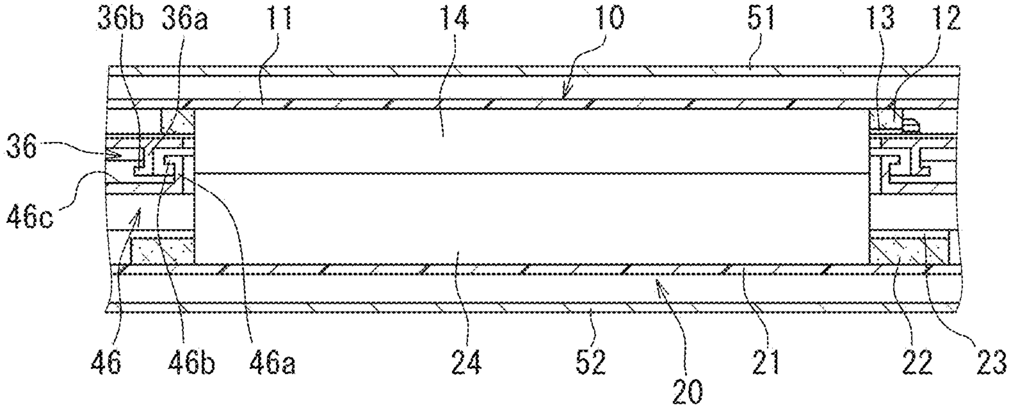
FIG. 13 is a cross-sectional view taken along a line XIII-XIII in FIG. 11.

First, the second embodiment will be described with reference to FIGS. 11 to 18. As shown in FIG. 11, FIG. 12, and FIG. 13, the electronic device 101 includes a first circuit board 10, a second circuit board 20, a first housing member 30, and a second housing member 40. Also in the present embodiment, as an example, the electronic device 101 including the first cover 51, the second cover 52, the third cover 53, and the fourth cover 54 is adopted.

The first housing member 30 and the second housing member 40 are assembled in the similar manner to the first embodiment. Therefore, the electronic device 101 has the hollow part SP3 through which the cooling water CW1 flows. Alternatively, the electronic device 101 may not have the hollow part SP3. In other words, it is not always necessary that the electronic device 101 have a space through which the cooling water CW1 flows. The state in which the first housing member 30 and the second housing member 40 are assembled together is also referred to as an assembled state.

Figure 15:
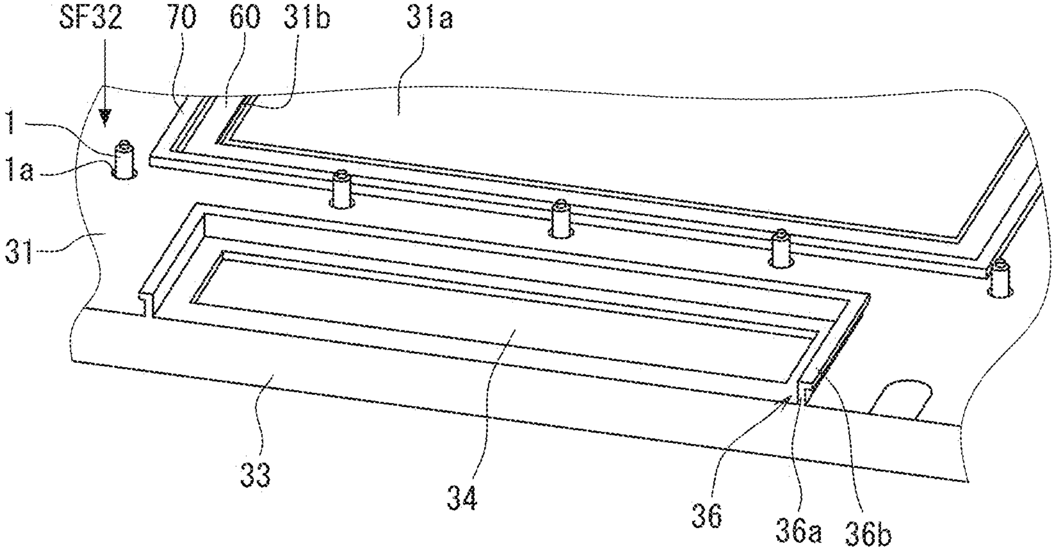
FIG. 15 is a perspective view showing a schematic configuration on a facing surface side of a first housing member of the electronic device.
Figure 16:
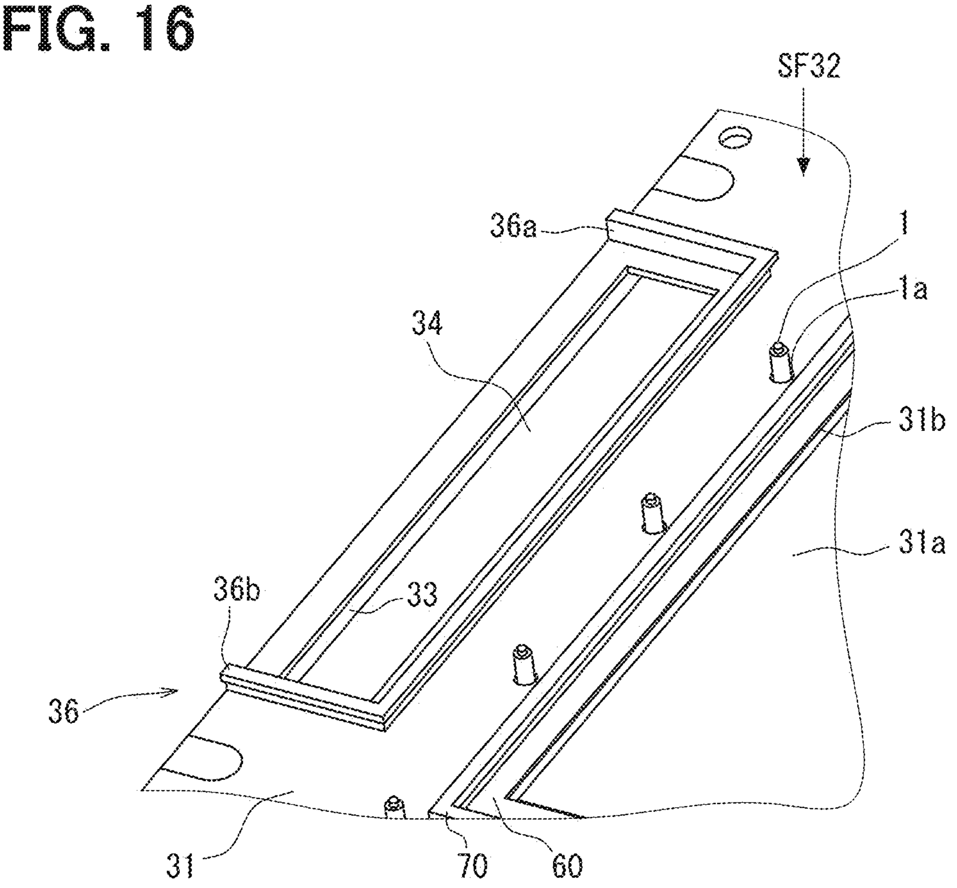
FIG. 16 is a perspective view showing a schematic configuration on a facing surface side of the first housing member.

As shown in FIG. 15 and FIG. 16, the first housing member 30 has a first water protection section 36 that includes a first protruding portion 36*a* and a first folded portion 36*b*. The first protruding portion 36*a* and the first folded portion 36*b* correspond to a protruding part.

The first protruding portion 36*a* and the first folded portion 36*b* are provided at positions facing the second housing member 40. The first protruding portion 36*a* is a portion that protrudes from the facing surface SF32. The first protruding portion 36*a* protrudes from the facing surface SF32 toward the facing surface SF42 of the second housing member 40.

The first protruding portion 36*a* is provided at a position surrounding the periphery of the first opening 34. As an example, a configuration in which the first protruding portion 36*a* is provided along three continuous sides of the first opening 34 is adopted. The first protruding portion 36*a* is provided so that both ends are exposed on the side wall 33 side. In other words, both ends of the first protruding portion 36*a* are flush with the side wall 33. Alternatively, the first protruding portion 36*a* may be provided in an annular shape so as to surround the entire periphery of the first opening 34.

The first folded portion 36*b* is a member that protrudes from a part of the first protruding portion 36*a*. For example, the first folded portion 36*b* is provided so as to project from the tip of the first protruding portion 36*a*. The first folded portion 36*b* projects in the opposite direction to the first opening 34 relative to the first projecting portion 36*a*. The first folded portion 36*b* is provided over the entire area of the tip of the first protruding portion 36*a*. The entire area refers to the area from one end to the other end of the first protruding portion 36*a*, both ends being exposed on the side wall 33 side. Alternatively, the first housing member 30 may not have the first folded portion 36*b*.

Figure 17:
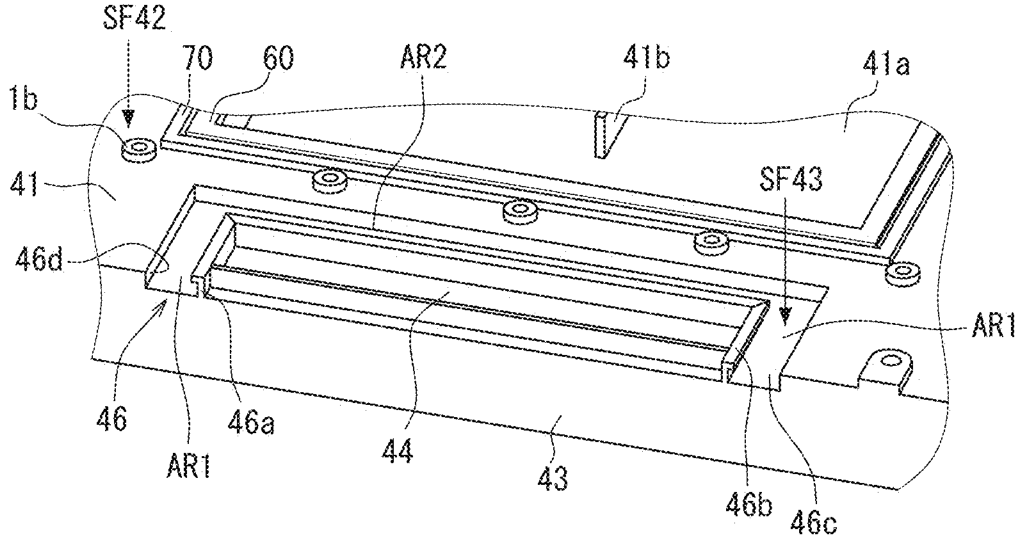
FIG. 17 is a perspective view showing a schematic configuration on a facing surface side of a second housing member of the electronic device.
Figure 18:
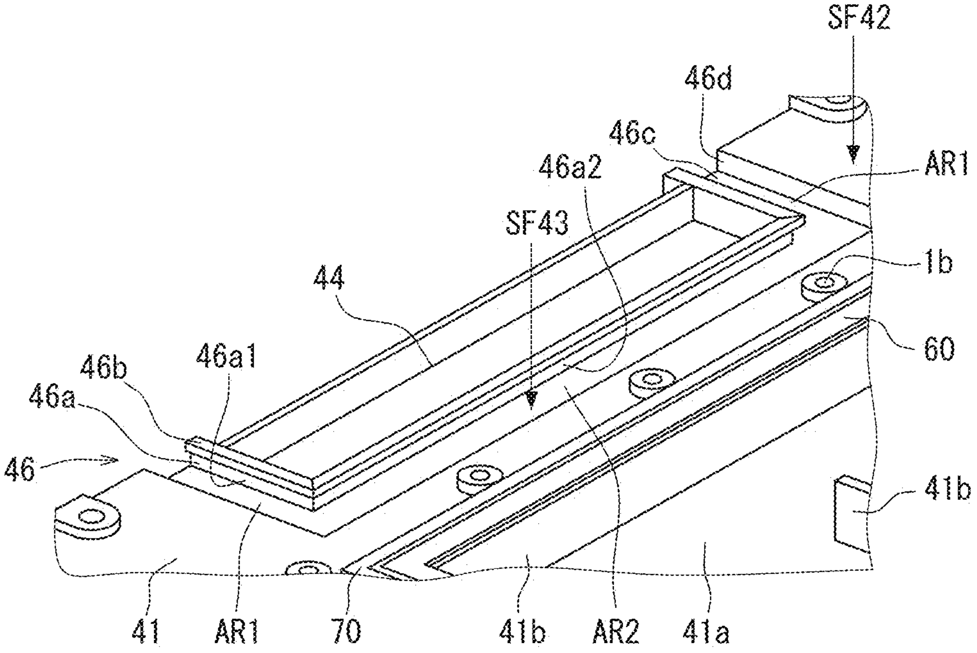
FIG. 18 is a perspective view showing a schematic configuration on the facing surface side of the second housing member.

As shown in FIG. 17 and FIG. 18, the second housing member 40 has a second water protection section 46 including a groove part 46*c*. It can be said that the groove part 46*c* is defined by an inner wall portion, which includes a second protruding portion 46*a* and a second folded portion 46*b*, an outer wall portion 46*d*, and a bottom surface SF43. Therefore, it can be said that the second housing member 40 has, as the second water protection portion 46, the inner wall portion, the outer wall portion 46*d*, and the bottom surface SF43 that form the groove part 46*c*. The second water protection section 46 is provided at a position facing the first housing member 30.

The groove part 46*c* is a portion recessed with respect to the facing surface SF42. Therefore, a bottom surface SF43 of the groove part 46*c* is provided at a position one step lower than the facing surface SF42. Alternatively, the bottom surface SF43 and the facing surface SF42 of the groove part 46*c* may be provided at the same position in the Z direction. In this case, the second protruding portion 46*a* and the outer wall portion 46*d* are provided to protrude from the facing surface SF42.

Figure 14:
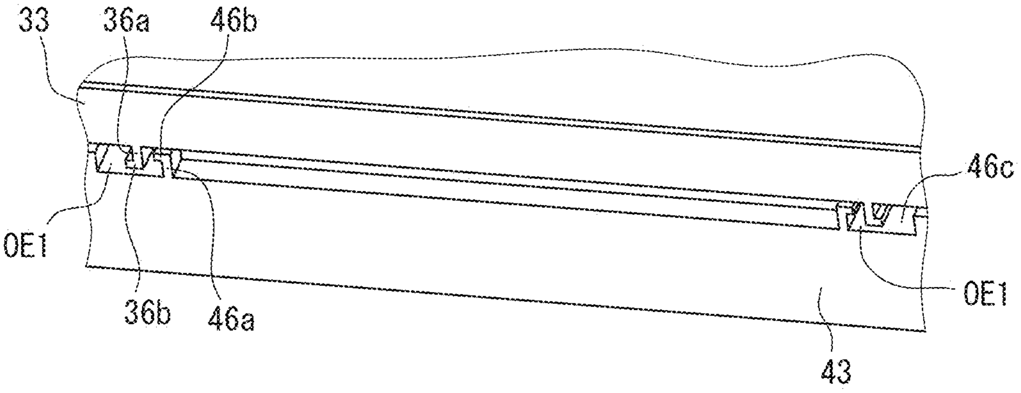
FIG. 14 is a perspective view showing a schematic configuration of an open end side of the electronic device.

The groove part 46*c* is provided at a position surrounding the periphery of the second opening 44. Here, as an example, a configuration in which the groove part 46*c* is provided along three continuous sides of the second opening 44 is adopted. The groove part 46*c* is provided so that both open ends are exposed on the side wall 43 side. Therefore, as shown in FIG. 14 and other figures, both ends of the groove part 46*c* can be said to have open ends OE1 that are open on the side wall 43 side, which is the end portion of the second housing member 40. That is, the groove part 46*c* is open on the side wall 43 side though a facing area on the bottom surface SF43 is covered by the first housing member 30. Further, the groove part 46*c* communicates from one open end OE1 to the other open end OE1. The side wall 43 corresponds to an end portion.

The groove part 46*c* includes two first facing regions AR1 provided at opposite sides of the connectors 14 and 24 and including the open ends OE1, and a second facing region AR2 communicating with the two first facing regions AR1. The first facing region AR1 and the second facing region AR2 are regions that face the connectors 14, 24 (second opening 44) in a planar direction including the XY plane.

Alternatively, the groove part 46*c* may be provided in an annular shape so as to surround the entire periphery of the second opening 44. The first facing region AR1 can also be referred to as a region along the short side direction of the connectors 14 and 24. On the other hand, the second facing region AR2 can also be referred to as a region along the longitudinal direction of the connectors 14 and 24.

The second protruding portion 46*a* and the second folded portion 46*b* are provided at positions facing the first housing member 30. The second protruding portion 46*a* is a portion that protrudes from the bottom surface SF43. The second protruding portion 46*a* protrudes from the bottom surface SF43 toward the facing surface SF32. The second protruding portion 46*a* includes first wall portions 46*a*1 that define the first facing regions AR1, and a second wall portion 46*a*2 that defines the second facing region AR2.

The second protruding portion 46*a* is provided at a position surrounding the periphery of the second opening 44. The second protruding portion 46*a* is provided in an annular shape so as to surround the entire periphery of the second opening 44.

The second folded portion 46*b* is a member that protrudes from a part of the second protruding portion 46*a*. For example, the second folded portion 46*b* is provided so as to protrude from the tip of the second protruding portion 46*a*. The second folded portion 46*b* projects in the opposite direction to the second opening 44 relative to the second protruding portion 46*a*. The second folded portion 46*b* is provided over the entire area of the tip of the second protruding portion 46*a*. The entire area refers to the area from one end to the other end of the second protruding portion 46*a*, both the ends being exposed on the side wall 43 side. Alternatively, the second housing member 40 may not have the second folded portion 46*b*. It can also be said that the inner wall portion of the groove part 46*c* is formed by the second protruding portion 46*a* and a part of the second folded portion 46*b*.

The outer wall portion 46*d* is a portion that protrudes from the bottom surface SF43 toward the facing surface SF32. The outer wall portion 46*d* is provided at a position surrounding the second protruding portion 46*a* and the second folded portion 46*b* of the inner wall portion and the periphery of the second opening 44. The outer wall portion 46*d* is provided to face the second protruding portion 46*a*. Here, as an example, a configuration in which the outer wall portion 46*d* is provided along three continuous sides of the second opening 44 is adopted. The outer wall portion 46*d* is provided so that both ends are exposed on the side wall 43 side. In other words, both ends of the outer wall portion 46*d* are flush with the side wall 43.

As shown in FIG. 12, FIG. 13, and FIG. 14, the first water protection section 36 and the second water protection section 46 are disposed to face to each other in an assembled state of the electronic device 101. The first protruding portion 36*a* and a portion of the first folded portion 36*b* are disposed in the groove part 46*c*. Therefore, the first protruding portion 36*a* and the first folded portion 36*b* are disposed to face the second protruding portion 46*a* and a part of the second folded portion 46*b* which constitute the inner wall portion of the groove part 46*c*.

The first folded portion 36*b* is disposed closer to the bottom surface SF43 of the groove part 46*c* than the second folded portion 46*b*. It can also be said that the first protruding portion 36*a* and the first folded portion 36*b* are disposed to face the second protruding portion 46*a* and a part of the second folded portion 46*b* along the protruding direction of the first folded portion 36*b*.

It is preferable that a gap be formed between the first protruding portion 36*a* and the first folded portion 36*b* and the bottom surface SF4 in the assembled state. Similarly, it is preferable that a gap be formed between the second protruding portion 46*a* and the second folded portion 46*b* and the facing surface SF32 in the assembled state. Such configuration restricts the water protection sections 36, 46 from impeding the assembly of the first housing member 30 and the second housing member 40 when the electronic device 101 is in the assembled state. In other words, the electronic device 101 can be assembled without interference between the first housing member 30 and the second housing member 40.

The electronic device 101 configured in this manner is mounted on a vehicle or the like so that, in the direction of gravity, the side walls 33 and 43 are on the lower surface and the side walls 32 and 42 are on the upper surface. Therefore, in the electronic device 101, the water protection sections 36, 46 are disposed below the hollow part SP3.

In the electronic device 101, the cooling water CW1 may leak due to deterioration of the sealing member 60 as described above. In addition, water droplets may adhere to the first housing member 30 and the second housing member 40 due to condensation. Furthermore, water or the like may enter the first housing member 30 and the second housing member 40 through the open ends OE1. That is, in the electronic device 101, there is a fear that the cooling water CW1 or water droplets may flow toward the connectors 14 and 24. Hereinafter, the cooling water CW1, water droplets, and water will be collectively referred to as liquid.

However, the electronic device 101 is provided with the water protection sections 36 and 46. That is, in the electronic device 101, the first protruding portion 36*a* surrounding the periphery of the first opening 34 in the first housing member 30 is disposed in the groove part 46*c* surrounding the periphery of the second opening 44 in the second housing member 40. Therefore, the electronic device 101 can suppress the liquid flowing from the outside of the connectors 14 and 24 from adhering to the connectors 14 and 24 by means of the groove part 46*c* and the first protruding portion 36*a*. In other words, the electronic device 101 can restricts the connectors 14 and 24 from the liquid.

Furthermore, in the electronic device 101, open ends OE1 are formed at both ends of the groove part 46*c*. Therefore, even if the liquid flows into the groove part 46*c*, the electronic device 101 can allow the liquid to escape to the outside of the electronic device 101. In other words, the electronic device 101 can suppress the liquid from remaining around the connectors 14 and 24.

In addition, the electronic device 101 is provided with the first folded portion 36*b* and the second folded portion 46*b*. Therefore, the electronic device 101 can further suppress the liquid from flowing into the openings 34 and 44. As such, the electronic device 101 can further suppress the connectors 14 and 24 from becoming wet.

First Modification

Figure 19:
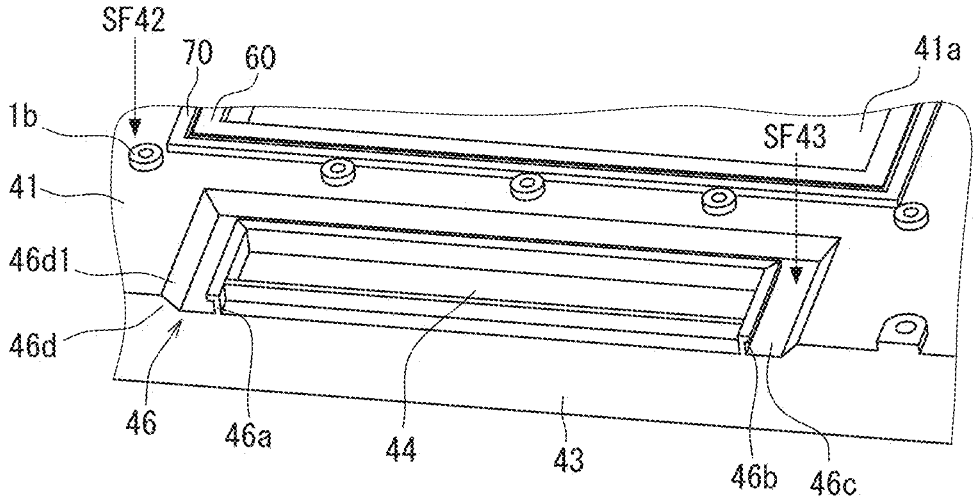
FIG. 19 is a perspective view showing a schematic configuration on a facing surface side of a second housing member in a first modification.

Next, a first modification of the electronic device 101 will be described with reference to FIG. 19 and FIG. 20. As shown in FIG. 19, the outer wall portion 46*d* may be formed with an outer wall inclined portion 46*d*1. In other words, the surface of the outer wall portion 46*d* that faces the first protruding portion 36*a* and the first folded portion 36*b* is inclined. The outer wall portion 46*d* slopes down from the facing surface SF42 toward the bottom surface SF43. The outer wall inclined portion 46*d*1 is a flat surface. It can be said that the outer wall portion 46*d* has the outer wall inclined portion 46*d*1 that forms an angle of 90 degrees or more with respect to the bottom surface SF43.

As such, the electronic device 101 allows the liquid to easily flow from the facing surface SF42 to the bottom surface SF43. Therefore, the electronic device 101 can easily release the liquid to the outside of the electronic device 101 via the groove part 46*c*, and the connectors 14 and 24 can be further suppressed from becoming wet.

Figure 20:
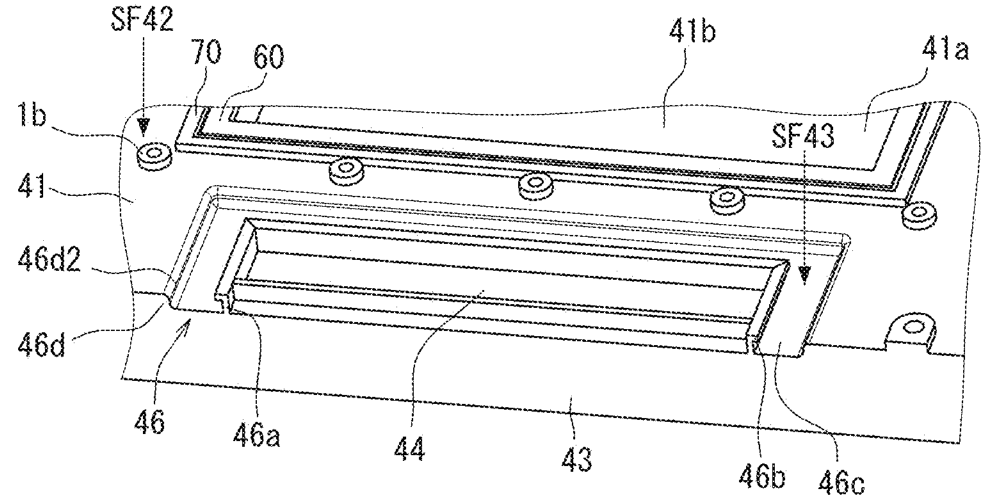
FIG. 20 is a perspective view showing a schematic configuration on a facing surface side of the second housing member in the first modification.

As shown in FIG. 20, the outer wall portion 46*d* may be provided with an outer wall curved portion 46*d*2. In other words, the surface of the outer wall portion 46*d* that faces the first protruding portion 36*a* and the first folded portion 36*b* is a curved surface. The outer wall portion 46*d* is inclined so as to form a curved downward slope from the facing surface SF42 toward the bottom surface SF43. With this, the electronic device 101 can further suppress the connectors 14 and 24 from becoming wet, in the similar manner to the configuration described above.

Second Modification

Figure 21:
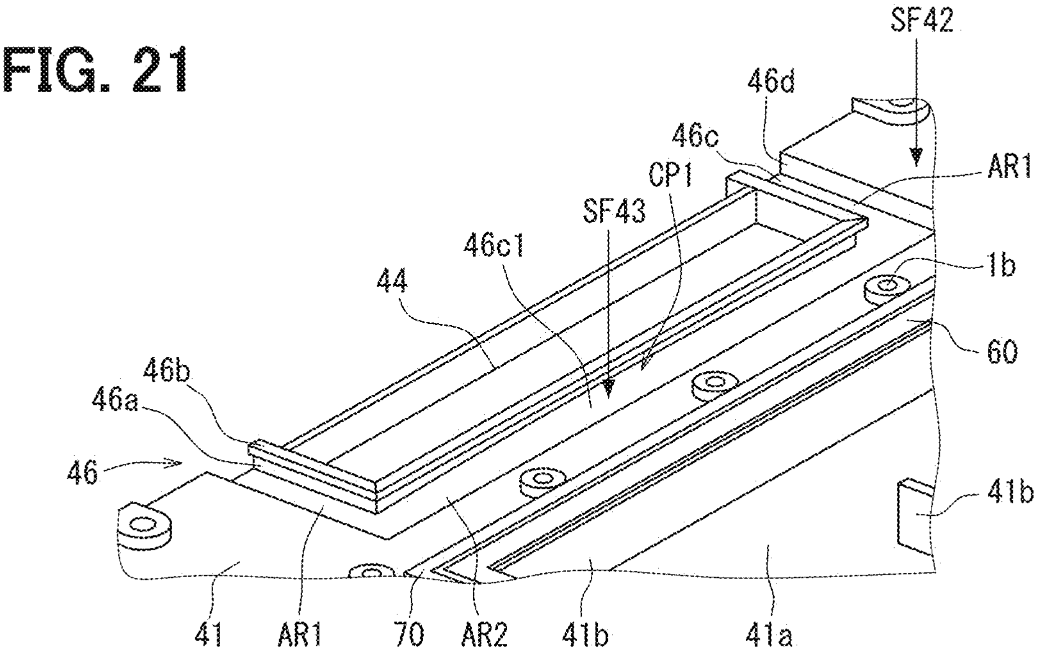
FIG. 21 is a perspective view showing a schematic configuration on a facing surface side of a second housing member in a second modification.

Next, a second modification of the electronic device 101 will be described with reference to FIG. 21. The groove part 46*c* may have a bottom surface SF43 that is partially curved. That is, the groove part 46*c* has a curved portion 46*c*1 with a curved shape in a part of the bottom surface SF43 in the second facing region AR2. The curved portion 46*c*1 is curved such that a center portion CP1 of the second facing region AR2 protrudes toward the first housing member 30 side. That is, the curved portion **46*c*1 forms a curved downward slope from the center portion CP1 toward the first facing regions AR1**.

With this, the electronic device 101 allows the liquid to easily flow from the second facing region AR2 to the first facing regions AR1. Therefore, the electronic device 101 can easily release the liquid to the outside, and the connectors 14 and 24 can be further suppressed from becoming wet. The bottom surface SF43 in the second facing region AR2 may have a flat sloped shape that slopes downward toward the first facing regions AR1 from the center portion CP1 as an apex, providing a similar effect.

Third Modification

Figure 22:
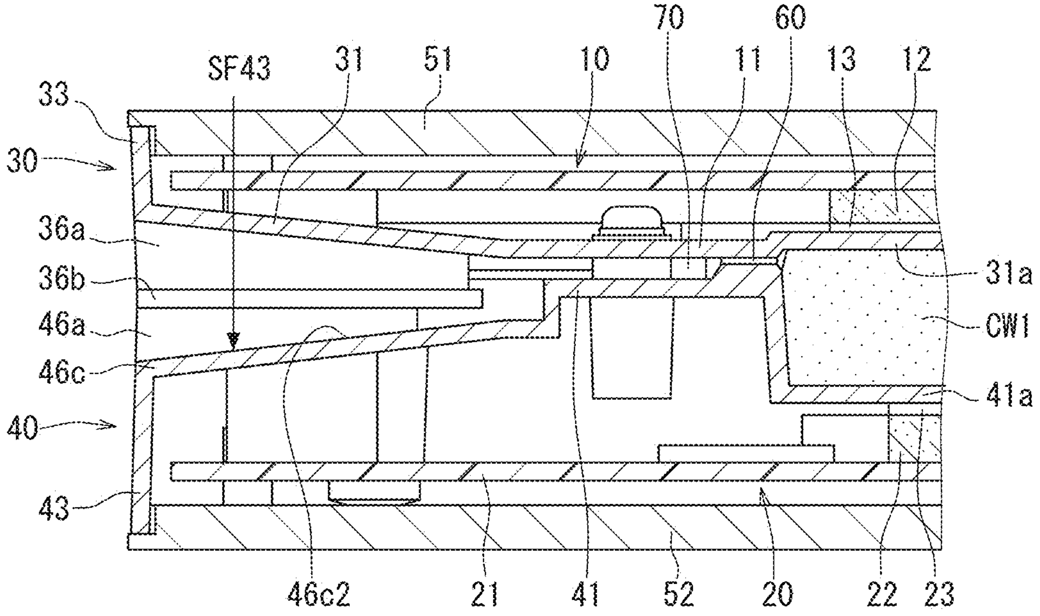
FIG. 22 is a cross-sectional view showing a schematic configuration of a part of an electronic device in a third modification.

Next, a third modification of the electronic device 101 will be described with reference to FIG. 22. The bottom surface SF43 of the groove part **46*c* in the first facing region AR1 may have an inclined portion 4602 that is inclined so as to separate away from the first housing member 30. In other words, the first facing region AR1 of the groove part 46*c* may have an inclined portion 46*c*2 that is inclined such that the distance between the groove part 46*c* and the first housing member 30 increases from the second facing region AR2 toward the open ends OE1. With this, the electronic device 101 allows the liquid to easily flow from the first facing region AR1 to the outside. Therefore, the electronic device 101 can further suppress the connectors 14 and 24** from becoming wet.

Fourth Modification

Next, a fourth modification of the electronic device 101 will be described with reference to FIGS. 23 to 25. The groove part **46*c* may be configured such that a portion constituting the second facing region AR2 is inclined from the center portion CP1 toward the open ends OE1. In other words, the groove part 46*c* may be configured to be inclined from the center portion CP1 toward the open ends OE1 when viewed from the top. The top view is a view when the facing surface SF42 is viewed along the Z direction in the drawing. Therefore, the top view corresponds to a plan view of the opposing surface SF42** side.

Figure 23:
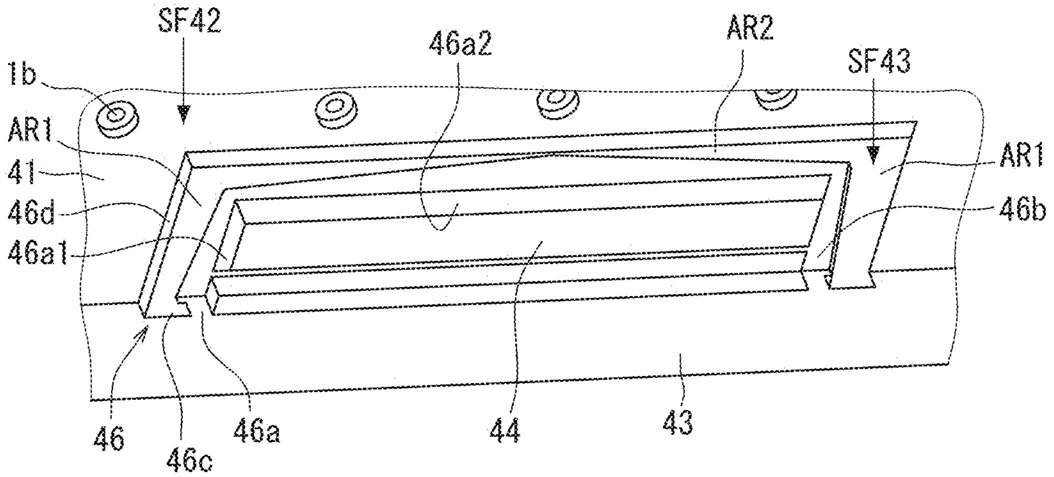
FIG. 23 is a perspective view showing a schematic configuration on a facing surface side of a second housing member of an electronic device in a fourth modification.
Figure 24:
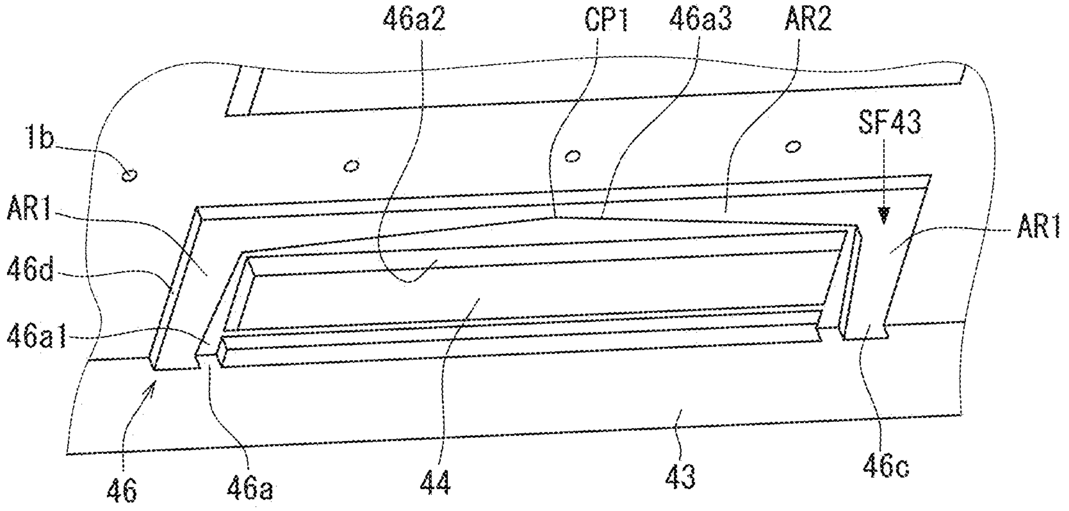
FIG. 24 is a perspective view showing a schematic configuration on a facing surface side of a second housing member of an electronic device in another example of the fourth modification.

As shown in FIG. 23 and FIG. 24, the groove part **46*c* is configured such that, for example, a second wall portion 46*a*2 which is a part constituting the second facing region AR2 is inclined from the center portion CP1 toward the open ends OE1. That is, the surface of the second wall portion 46*a*2 facing the outer wall portion 46*d* is an inclined surface 46*a*3. Further, the second wall portion 46*a*2 has inclined surfaces 46*a*3 between the center portion CP1 and both the first protruding portions 36*a*. In the mounted state as described above, the second wall portion 46*a*2 has the inclined surfaces 46*a*3 that slopes downward from the center portion CP1**.

Therefore, the second wall portion **46*a*2 is provided such that the distance between the second wall portion 46*a*2 and the outer wall portion 46*d* becomes wider from the central portion CP1 toward the first opposing regions AR1. The distance between the side wall 43 and the inclined surface 46*a*3 is the widest at the center portion CP1 and gradually narrows from the center portion CP1 toward the first facing regions AR1**.

Figure 25:
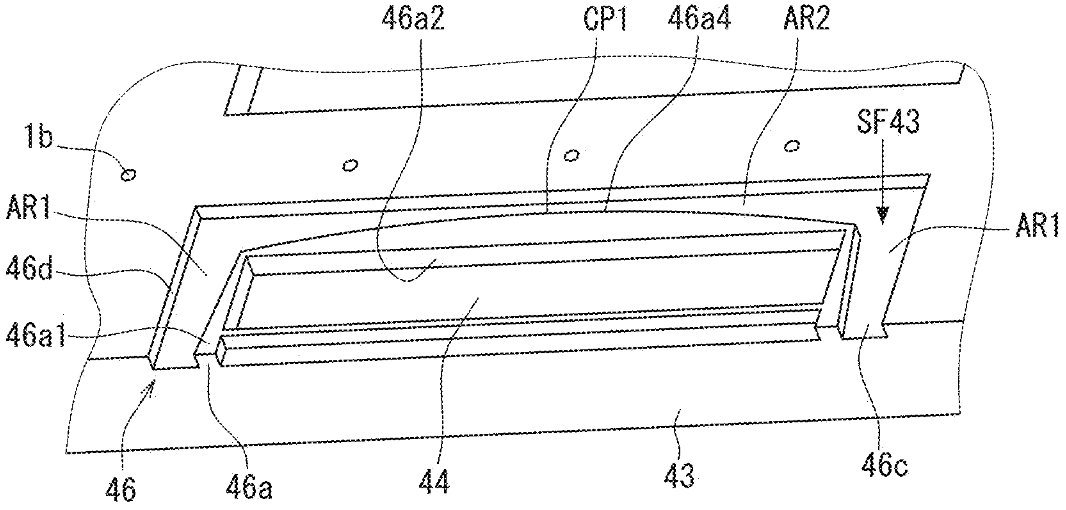
FIG. 25 is a perspective view showing a schematic configuration on a facing surface side of a second housing member of an electronic device in further another example of the fourth modification.

As shown in FIG. 25, the inclined surface **46*a*3 may have a curved shape. That is, the surface of the second wall portion 46*a*2 facing the outer wall portion 46*d* is a curved surface 46*a*4. It can also be said that the groove part 46*c* is configured such that the portion constituting the second facing region AR2 is curved from the center portion CP1 toward the open ends OE1. FIG. 25 is a cross-sectional view corresponding to FIG. 24**.

With this, the electronic device 101 allows the liquid to easily flow from the second facing region AR2 to the outside. Therefore, the electronic device 101 can further suppress the connectors 14 and 24 from becoming wet.

Furthermore, the electronic device 101 may be configured such that the outer wall portion **46*d* is inclined in the similar manner to the second wall portion 46*a*2. In other words, the outer wall portion 46*d* may be provided parallel to the inclined surface 46*a*3 or the curved surface 46*a*4**.

In this modification, as shown in FIG. 23, the configuration in which the second folded portion **46*b* continuing to the second wall portion 46*a*2 is also inclined is shown. Alternatively, the second folded portion 46*b*** may not be inclined.

In this modification, the second protruding portion **46*a* is also inclined. That is, the distance between the second protruding portion 46*a* and the outer wall portion 46*d* becomes narrower from the second facing region AR2 toward the open ends OE1 in the first opposing region AR1. Alternatively, the second protruding portion 46*a*** may not be inclined.

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

What is claimed is:

1. An electronic device comprising:

a first housing member that houses a first circuit board;

a second housing member that houses a second circuit board and is assembled to the first housing member; and a connector that electrically connects the first circuit board and the second circuit board, wherein the second housing member is formed with a second opening in which the connector is disposed, and includes a groove part provided at a position facing the first housing member and surrounding a periphery of the second opening, the first housing member is formed with a first opening in which the connector is disposed, and includes a protruding part provided at a position facing the second housing member, surrounding a periphery of the first opening, and disposed in the groove part; and the second housing member includes an inner wall portion and an outer wall portion that protrude toward the first housing member and define the groove part therebetween on the periphery of the second opening.

2. The electronic device according to claim 1, wherein the protruding part has a first folded portion that protrudes in a direction opposite to the first opening.

3. The electronic device according to claim 1, wherein the inner wall portion has a second folded portion that protrudes in a direction opposite to the second opening.

4. The electronic device according to claim 3, wherein the outer wall portion is inclined or curved.

5. The electronic device according to claim 3, wherein the protruding part is disposed to face the inner wall portion.

6. The electronic device according to claim 1, wherein the groove part have open ends at opposite ends thereof, the open ends opening on an end of the second housing member.

7. The electronic device according to claim 6, wherein the groove part includes two first facing regions and a second facing region in communication with the two first facing regions, the two first facing regions include the open ends and are disposed on opposite sides of the connector, and a bottom surface of the groove part in the second facing region has a curved portion a center of which protrudes toward the first housing member.

8. The electronic device according to claim 6, wherein the groove part includes two first facing regions and a second facing region connecting to the two first facing regions, the two first facing regions include the open ends and are disposed on opposite sides of the connector, and a bottom surface of the groove part in each first facing region has an inclined portion that is inclined so as to be away from the first housing member.

9. The electronic device according to claim 7, wherein the groove part is curved from the center toward the open ends in the second facing region.

10. The electronic device according to claim 7, wherein the groove part is inclined from the center toward the open ends in the second facing region.

11. The electronic device according to claim 1, Wherein the groove part defined between the inner wall portion and the outer wall portion is provided between a first facing surface of the first housing member and a second facing surface of the second housing member facing each other.

12. An electronic device, comprising:

a first housing member that houses a first circuit board;

a second housing member that houses a second circuit board and is assembled to the first housing member;

a connector that electrically connects the first circuit board and the second circuit board, wherein the second housing member is formed with a second opening in which the connector is disposed, and includes a groove part provided at a position facing the first housing member and surrounding a periphery of the second opening, and the first housing member is formed with a first opening in which the connector is disposed, and includes a protruding part provided at a position facing the second housing member, surrounding a periphery of the first opening, and disposed in the groove part, the first housing member and the second housing member, assembled to each other, define a hollow part between facing surfaces thereof, and a sealing member is disposed between the first housing member and the second housing member to surround the hollow part, the groove part is disposed outside of the sealing member, wherein the hollow part allows a liquid refrigerant to flow.

13. The electronic device according to claim 12, wherein the protruding part has a first folded portion that protrudes in a direction opposite to the first opening.

14. The electronic device according to claim 12, wherein the second housing member includes an inner wall portion and an outer wall portion that define the groove part, and the inner wall portion has a second folded portion that protrudes in a direction opposite to the second opening.

15. The electronic device according to claim 14, wherein the outer wall portion is inclined or curved.

16. The electronic device according to claim 14, wherein the protruding part is disposed to face the inner wall portion.

17. The electronic device according to claim 12, wherein the groove part have open ends at opposite ends thereof, the open ends opening on an end of the second housing member.

18. The electronic device according to claim 17, wherein the groove part includes two first facing regions and a second facing region in communication with the two first facing regions, the two first facing regions include the open ends and are disposed on opposite sides of the connector, and a bottom surface of the groove part in the second facing region has a curved portion a center of which protrudes toward the first housing member.

19. The electronic device according to claim 17, wherein the groove part includes two first facing regions and a second facing region connecting to the two first facing regions, the two first facing regions include the open ends and are disposed on opposite sides of the connector, and a bottom surface of the groove part in each first facing region has an inclined portion that is inclined so as to be away from the first housing member.

* * * * *